(12) United States Patent
Walke et al.

(10) Patent No.: US 10,833,704 B1
(45) Date of Patent: Nov. 10, 2020

(54) LOW-DENSITY PARITY CHECK DECODER USING ENCODED NO-OPERATION INSTRUCTIONS

(71) Applicant: Xilinx, Inc., San Jose, CA (US)

(72) Inventors: Richard L. Walke, Edinburgh (GB); Andrew Dow, Edinburgh (GB); Zahid Khan, Loanhead (GB)

(73) Assignee: Xilinx, Inc., San Jose, CA (US)

( * ) Notice: Subject to any disclaimer, the term of this patent is extended or adjusted under 35 U.S.C. 154(b) by 44 days.

(21) Appl. No.: 16/217,648

(22) Filed: Dec. 12, 2018

(51) Int. Cl.
*H03M 13/11* (2006.01)
*H03M 13/00* (2006.01)
*H03M 13/37* (2006.01)
*G06F 11/10* (2006.01)

(52) U.S. Cl.
CPC ..... *H03M 13/1105* (2013.01); *G06F 11/1076* (2013.01); *H03M 13/616* (2013.01)

(58) Field of Classification Search
None
See application file for complete search history.

(56) References Cited

U.S. PATENT DOCUMENTS

| | | | | |
|---|---|---|---|---|
| 5,893,143 A * | 4/1999 | Tanaka | ............ | G06F 9/3802 711/120 |
| 7,111,154 B2 * | 9/2006 | Rupley | ............ | G06F 9/3836 712/218 |
| 9,330,011 B2 * | 5/2016 | Parks | ............ | G06F 12/0875 |
| 9,548,759 B1 * | 1/2017 | Rad | ............ | H03M 13/116 |
| 9,577,675 B1 * | 2/2017 | Varnica | ............ | H03M 13/116 |
| 9,804,853 B2 * | 10/2017 | Park | ............ | G06F 9/3853 |
| 10,644,725 B1 | 5/2020 | Walke et al. | | |
| 2004/0268087 A1 * | 12/2004 | Rupley | ............ | G06F 9/3836 712/24 |

OTHER PUBLICATIONS

Specification and drawings for U.S. Appl. No. 16/112,588, filed Aug. 24, 2018, Walke et al.
Specification and drawings for U.S. Appl. No. 15/938,760, filed Mar. 28, 2018, Walke et al.

(Continued)

*Primary Examiner* — Phung M Chung
(74) *Attorney, Agent, or Firm* — Crawford Maunu PLLC

(57) ABSTRACT

Low-density parity check (LDPC) decoder circuitry is configured to decode an input codeword using a plurality of circulant matrices of a parity check matrix for an LDPC code. Multiple memory banks are configured to store elements of the input codeword. A memory circuit is configured for storage of an instruction sequence. Each instruction describes for one of the circulant matrices, a corresponding layer and column of the parity check matrix and a rotation. Each instruction includes packing factor bits having a value indicative of a number of instructions of the instruction sequence to be assembled in a bundle of instructions. A bundler circuit is configured to assemble the number of instructions from the memory circuit in a bundle. The bundler circuit specifies one or more no-operation codes (NOPs) in the bundle in response to the value of the packing factor bits and provides the bundle to the decoder circuitry.

20 Claims, 20 Drawing Sheets

(56) References Cited

OTHER PUBLICATIONS

Xilinx, "Soft-Decision FEC Integrated Block v1.1, LogiCORE IP Product Guide," PG256, Jun. 18, 2018, pp. 1-134, Xilinx, Inc., San Jose, California, USA.
Xilinx, "LDPC Encoder/Decoder 2.0 LogiCORE IP Product Guide," PG281, Apr. 4, 2018, pp. 1-127, Xilinx, Inc., San Jose, California, USA.
Specification and drawings for U.S. Appl. No. 16/137,935, filed Sep. 21, 2018, now issued as U.S. Pat. No. 10,644,725 (patent number also cited above).

* cited by examiner

```
1   for b = 1:B
2     for p = 1:P
3       for l = 1:L_b
4         v_{l,p}^b = v_{l,p}^b - upd\_vmodel_{l,p}^b
5       end
6       for l = 1:L_b
7         upd\_vmodel_{l,p}^b = \alpha \min(|v_{l,p}^b|) \prod sign(v_{l,p}^b)
8       end
9       for l = 1:L_b
10        v_{l,p}^b = v_{l,p}^b + upd\_vmodel_{l,p}^b
11      end
12    end
13  end
```

FIG. 4A

| | \multicolumn{10}{c}{column} | | | | | | | | | |
|---|---|---|---|---|---|---|---|---|---|---|
| layer | 0 | 1 | 2 | 3 | 4 | 5 | 6 | 7 | 8 | 9 |
| 1 | 174 | 97 | 166 | 66 | -1 | -1 | 0 | 0 | -1 | -1 |
| 2 | 27 | -1 | -1 | 36 | 48 | 92 | -1 | 0 | 0 | -1 |
| 3 | 25 | 114 | -1 | 117 | 110 | -1 | 1 | -1 | 0 | 0 |
| 4 | -1 | 136 | 175 | -1 | 113 | 72 | 0 | -1 | -1 | 0 |

| Layer | Instruction | COLUMN | ROTATION | PF2 | PF4 |
|---|---|---|---|---|---|
| 1 | 0 | 0 | 0 | 0 | 0 |
| 1 | 1 | 1 | 174 | x | x |
| 1 | 2 | 2 | 97 | 0 | x |
| 1 | 3 | 3 | 166 | x | x |
| 1 | 4 | 6 | 66 | 0 | 2 |
| 1 | 5 | 7 | 0 | x | x |
| 2 | 6 | 0 | 0 | 0 | 2 |
| 2 | 7 | 3 | 27 | x | x |
| 2 | 8 | 4 | 38 | 0 | 3 |
| 2 | 9 | 5 | 48 | x | x |
| 2 | 10 | 7 | 92 | 0 | 1 |
| 2 | 11 | 8 | 0 | x | x |
| 3 | 12 | 0 | 0 | 0 | 3 |
| 3 | 13 | 1 | 25 | x | x |
| 3 | 14 | 3 | 114 | 0 | x |
| 3 | 15 | 4 | 117 | 1 | 2 |
| 3 | 16 | 6 | 110 | 0 | x |
| 3 | 17 | 8 | 1 | x | 2 |
| 3 | 18 | 9 | 0 | 0 | x |
| 4 | 19 | 1 | 136 | x | 3 |
| 4 | 20 | 2 | 175 | 0 | x |
| 4 | 21 | 4 | 113 | x | x |
| 4 | 22 | 5 | 72 | 0 | 2 |
| 4 | 23 | 6 | 0 | x | x |
| 4 | 24 | 9 | 0 | 0 | 1 |

FIG. 13

| Layer | Bundle | 0 | 1 | 2 | 3 |
|---|---|---|---|---|---|
| 1 | 0 | 174 | 97 | 166 | 66 |
| 1 | 1 | NOP | NOP | 0 | 0 |
| 2 | 2 | 27 | NOP | NOP | 36 |
| 2 | 3 | 48 | 92 | NOP | 0 |
| 2 | 4 | 0 | NOP | NOP | NOP |
| 3 | 5 | 25 | 114 | NOP | 117 |
| 3 | 6 | 110 | NOP | 1 | NOP |
| 3 | 7 | 0 | 0 | NOP | NOP |
| 4 | 8 | 113 | 136 | 175 | NOP |
| 4 | 9 | NOP | 72 | 0 | NOP |
| 4 | 10 | NOP | 0 | NOP | NOP |

FIG. 14

| Layer | Bundle | 0 | 1 |
|---|---|---|---|
| 1 | 0 | 174 | 97 |
| 1 | 1 | 166 | 66 |
| 1 | 2 | 0 | 0 |
| 2 | 3 | 27 | 36 |
| 2 | 4 | 48 | 92 |
| 2 | 5 | 0 | 0 |
| 3 | 6 | 25 | 114 |
| 3 | 7 | 110 | 117 |
| 3 | 8 | 1 | NOP |
| 3 | 9 | 0 | 0 |
| 4 | 10 | 175 | 136 |
| 4 | 11 | 113 | 72 |
| 4 | 12 | 0 | 0 |

LOW-DENSITY PARITY CHECK DECODER USING ENCODED NO-OPERATION INSTRUCTIONS

TECHNICAL FIELD

The disclosure generally relates to processing of data blocks in low-density parity-check (LDPC) decoders.

BACKGROUND

Low-density parity-check (LDPC) codes are a class of error-correcting codes that may be efficiently encoded and decoded in hardware. LDPC codes are linear codes that have sparse parity-check matrices. The sparseness of the parity-check matrices allows for relatively fast decoding and computationally-inexpensive error correction. Many practical LDPC code designs use quasi-cyclic (QC) LDPC codes to yield more efficient hardware parallelization. Layered decoding is an efficient way of decoding LDPC codes and is commonly used in a wide range of applications. The number of cycles needed to process an entire layer of a base matrix associated with a QC LDPC code may depend on the hardware resources of the decoder.

Many existing LDPC decoders are preconfigured to support only a limited number of LDPC codes (e.g., for a particular communication standard). However, older LDPC codes are often phased out for newer LDPC codes as new communication standards are developed and existing standards are improved upon. Furthermore, some communication systems may use proprietary LDPC codes (e.g., for a backhaul network).

SUMMARY

A disclosed circuit arrangement includes low-density parity check (LDPC) decoder circuitry configured to decode an input codeword using a plurality of circulant matrices of a parity check matrix for an LDPC code. A plurality of memory banks are coupled to the LDPC decoder circuitry and are configured to store elements of the input codeword. A memory circuit is configured for storage of an instruction sequence. Each instruction describes for one of the plurality of circulant matrices, a corresponding layer and column of the parity check matrix and a rotation. Each instruction includes packing factor bits having a value indicative of a number of instructions of the instruction sequence to be assembled in a bundle of instructions. A bundler circuit is coupled to the memory circuit and to the LDPC decoder circuitry. The bundler circuit is configured to assemble a bundle of instructions including the number of instructions from the memory circuit. The bundler circuit specifies a no-operation code (NOP) in each slot of the bundle of instructions other than a slot that is filled with an instruction from the instruction sequence and provides the bundle of instructions to the decoder circuitry.

A disclosed method stores an instruction sequence in a memory circuit. Each instruction of the sequence describes for one of a plurality of circulant matrices of a parity check matrix for a low-density parity check (LDPC) code, a corresponding layer and column of the parity check matrix and a rotation. Each instruction includes packing factor bits having a value indicative of a number of instructions of the instruction sequence to be assembled in a bundle of instructions. The method stores elements of an input code word in a plurality of memory banks. A bundler circuit assembles a bundle of instructions including the number of instructions from the memory circuit and specifies a no-operation code (NOP) in each slot of the bundle of instructions other than a slot that is filled with an instruction from the instruction sequence in response to the value of the packing factor bits. The bundler circuit provides the bundle of instructions to LDPC decoder circuitry, and the LDPC decoder circuitry decodes an input codeword according to the bundle of instructions using the plurality of circulant matrices.

Other features will be recognized from consideration of the Detailed Description and Claims, which follow.

BRIEF DESCRIPTION OF THE DRAWINGS

Various aspects and features of the circuits and methods will become apparent upon review of the following detailed description and upon reference to the drawings in which:

FIG. 4A shows an example of a layered decoding operation;

FIG. 11 shows an example of an LDPC base matrix;

FIG. 13 shows a set of instructions that illustrates the storage requirements for instructions that are coded to avoid explicit specification of NOP instructions for the LDPC base matrix of FIG. 11;

FIG. 14 shows the bundles of instructions assembled for packing factor 4 based on the instruction set of FIG. 13 and the PF4 bits of the instructions;

FIG. 15 shows the bundles of instructions assembled for packing factor 2 based on the instruction set of FIG. 13 and the PF2 bits of the instructions;

DETAILED DESCRIPTION

Figure 1:
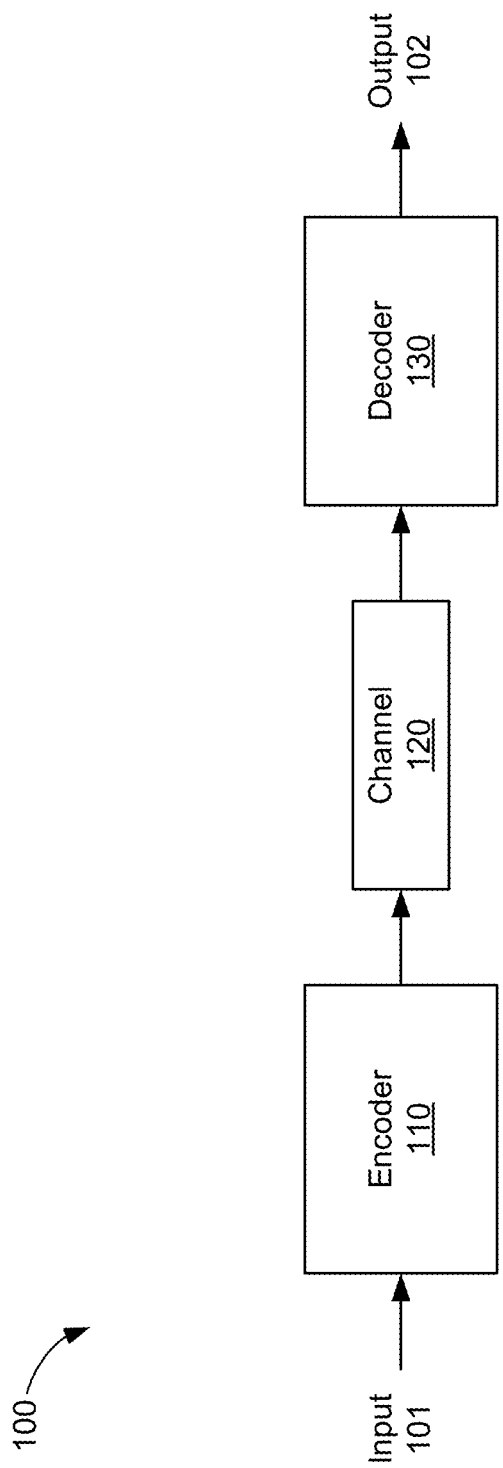
FIG. 1 is a block diagram of an exemplary communication system.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

This disclosure relates to encoded no-operation instructions (NOPs) in processing of data blocks in low-density parity-check (LDPC) decoders and encoders. LDPC codes are widely used in many communication standards. Some LDPC codes may use quasi-cyclic parity-check matrices for improved bit error rate. Such codes may be referred to as quasi-cyclic low-density parity-check (QC LDPC) codes. A parity-check matrix for a QC LDPC code may be represented by a base matrix and expansion sub-matrices that expand the elements of the base matrix. Some LDPC decoders use a layered approach to decoding QC LDPC codes, for example, by updating soft bit information from layer to layer of the parity-check matrix. Each layer corresponds to a row of the base matrix, which can include a plurality of rows of an expansion sub-matrix. Each sub-matrix of a parity-check matrix can be an all-zero matrix or a circulant matrix having a circulant weight equal to or greater than one. For a circulant matrix having a circulant weight of one, each row and column of the circulant matrix contains only one non-zero element. Thus, the rows of the circulant matrix can be processed in parallel (or concurrently) by an LDPC decoder.

Although an LDPC decoder may be capable of processing multiple rows of a circulant matrix in a single cycle, the number of cycles needed to process an entire layer of the base matrix (which may include multiple circulants) may depend on the hardware resources of the decoder. For example, when decoding an LDPC codeword, the codeword may first be stored in multiple memory banks of the decoder circuit. More specifically, each "column" of data in the codeword may be stored in one of the memory banks. The columns can be stored in the memory banks in a round-robin fashion based on the order of the columns in the codeword. The LDPC decoder can read selected columns from the memory banks (e.g., based on the arrangement of circulants in the parity-check matrix) to perform LDPC decoding on the codeword. However, the LDPC decoder may read only one column of data from each of the memory banks at a time (e.g., in parallel). Accordingly, the number of processing cycles needed to process a layer of the base matrix may depend on the order in which the columns of the codeword are stored in the memory banks.

FIGS. 1-5C show aspects of LDPC decoding that involves a codeword stored across multiple memory banks. FIG. 6-17 illustrates aspects of LDPC decoding of an input code word following instructions that direct circulant operations and the use of encoded NOPs within the instructions.

FIG. 1 is a block diagram of an exemplary communication system 100. The communication system includes an encoder 110, a channel 120, and decoder 130. The encoder 110 and decoder 130 may be provided in respective communication devices such as, for example, computers, switches, routers, hubs, gateways, or other devices capable of transmitting and/or receiving communication signals. The channel 120 may be a wired or wireless communication link between the encoder 110 and the decoder 130.

The encoder 110 may receive an input 101 comprising message data to be transmitted to the decoder 130 via the channel 120. However, imperfections in the channel 120 may introduce channel distortion (e.g., non-linear distortion, multi-path effects, Additive White Gaussian Noise (AWGN), and/or other signal impairments). Thus, the encoder 110 may encode the input 101 prior to transmission. In some implementations, the encoder 110 may encode the input 101 in accordance with an LDPC code so that error correction may be performed at the decoder 130. For example, the encoder 110 may generate an LDPC codeword as a result of the encoding. The LDPC codeword may be transmitted, over the channel 120, to the decoder 130. Upon receiving the LDPC codeword, the decoder 130 may use a parity-check matrix associated with the LDPC code to decode the received codeword. More specifically, the decoded codeword may be provided as an output 102 from the decoder 130. If channel 120 introduces errors (e.g., flipped bits) into the transmitted codeword, the decoder 130 may detect and correct such errors using the parity-check matrix.

Figure 2A:
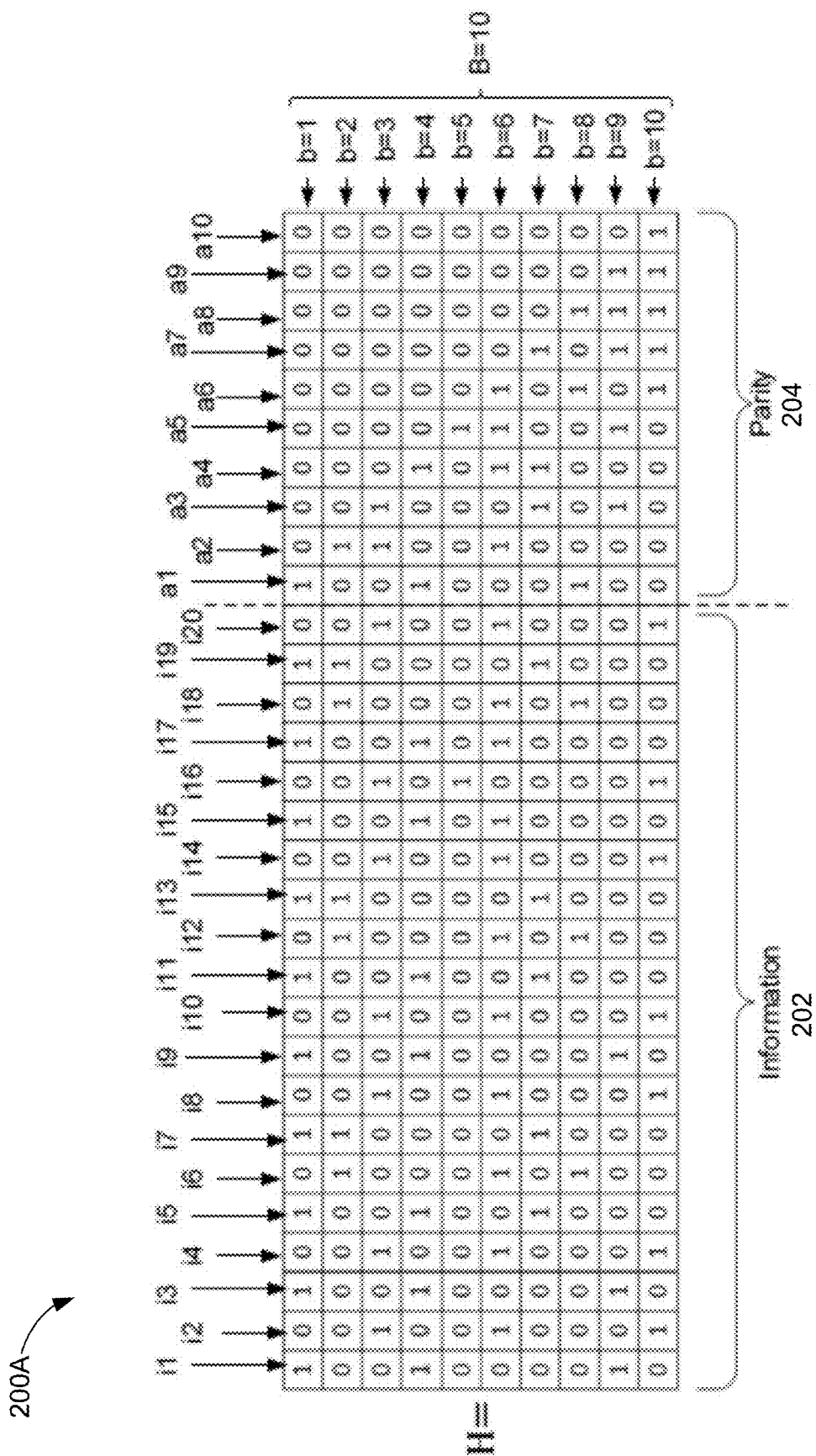
FIG. 2A shows an exemplary parity-check matrix for an LDPC code.

FIG. 2A shows an exemplary parity-check matrix 200A for an LDPC code. The parity-check matrix 200A includes an information part 202 and a parity part 204. The information part 202 of the parity-check matrix 200A may correspond to information bits of an LDPC codeword (e.g., information bits $i_1$ through $i_{20}$ for each row). The parity part 204 of the parity-check matrix 200A may correspond to parity bits of the LDPC codeword (e.g., parity bits $a_1$ through $a_{10}$ for each row). The decoder 130 may determine that a received codeword (c) is a valid codeword if the following condition is satisfied: $Hc^T=0$, where H represents the parity-check matrix 200A.

Figures 2B, 2C:
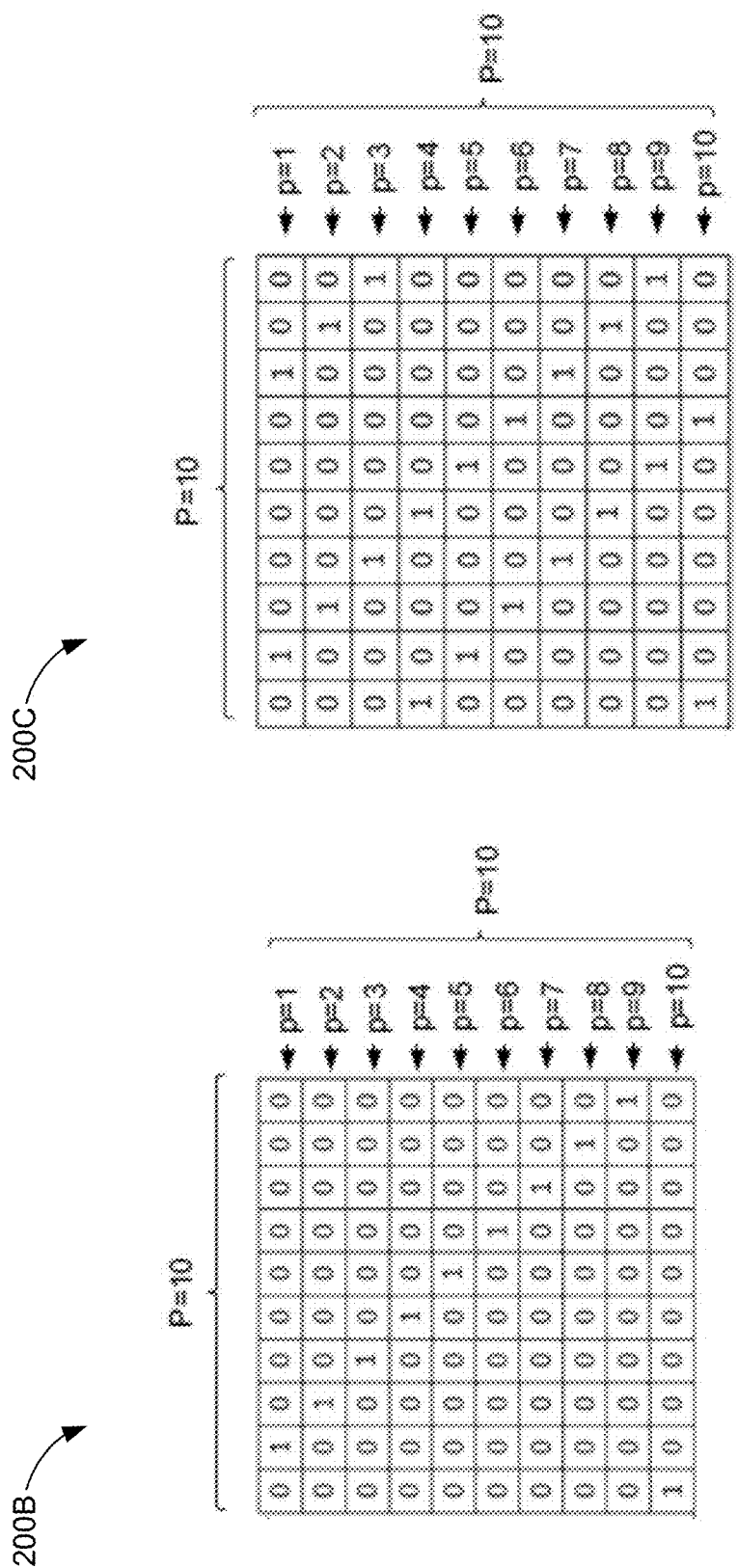
FIG. 2B shows a circulant sub-matrix having a circulant weight equal to 1.
FIG. 2C shows a circulant sub-matrix having a circulant weight equal to 2.

The parity-check matrix 200A may correspond to a base matrix of a QC LDPC code. Each row of the base matrix may be referred to as a "layer," and may be assigned a particular layer index (b) based on the total number (B) of layers in the base matrix. In the example of FIG. 2A, the base matrix 200A is shown to have a total of 10 layers (e.g., B=10). Within a given layer, each column of the base matrix 200A (e.g., $i_1$ through $i_{20}$) may comprise a sub-matrix. For example, each "0" in the parity-check matrix 200A may be expanded to an all-zero sub-matrix, and each "1" in the parity-check matrix 200A may be expanded to a circulant sub-matrix having a circulant weight equal to or greater than 1. With reference for example to FIG. 2B, a circulant sub-matrix 200B is shown having a circulant weight equal to 1. Thus, each row and column of the circulant sub-matrix 200B contains only one non-zero element. Some QC LDPC codes may include circulant sub-matrices with circulant weight greater than 1. With reference for example to FIG. 2C, a circulant sub-matrix 200C is shown having a circulant weight equal to 2. Thus, each row and column of the circulant sub-matrix 200C contains exactly two non-zero elements.

Figure 3:
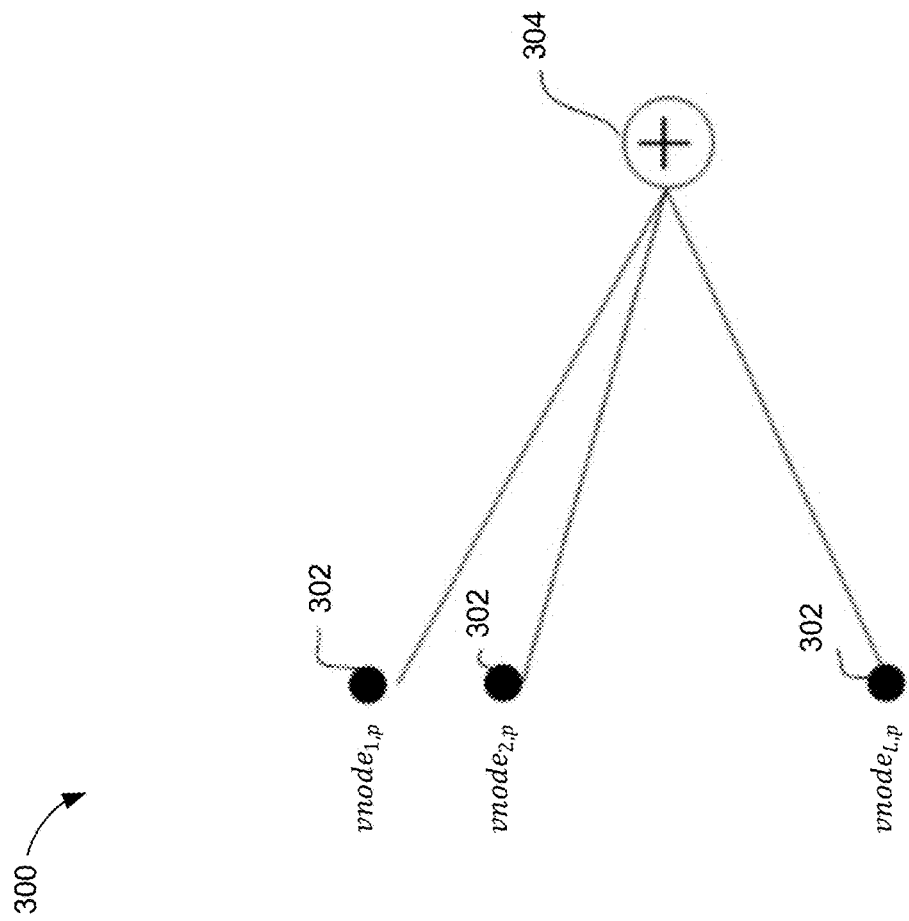
FIG. 3 shows an example of a bipartite graph representing a row of a parity-check matrix.

FIG. 3 shows an example of a bipartite graph 300 representing a row of a parity-check matrix. The bipartite graph 300 (which may also be referred to as a Tanner graph)

includes a set of variable nodes 302 (vnode$_{1,p}$ to vnode$_{L,p}$) and a check node 304. The "edges" (e.g., lines) in the bipartite graph 300 connect the variable nodes 302 to the check node 304. More specifically, vnode$_{l,p}$ denotes the l$^{th}$ variable node 302 that participates in the p$^{th}$ row of the parity-check matrix, where L is the total number of non-zero bits in the p$^{th}$ row of the parity-check matrix. With reference for example to FIG. 2A, there are 11 bits (or columns) that participate in the parity-check operation associated with the first row (or layer) of the parity-check matrix 200A, thus L=11 and vnode$_{1,p}$ to vnode$_{L,p}$ are associated with codeword bits i1, i3, i5, i7, i9, i11, i13, i15, i17, i19 and a1, and columns 1, 3, 5, 7, 9, 11, 13, 15, 17, 19, and 21.

An LDPC decoder may decode a received codeword (c) by exchanging messages within the bipartite graph 300, along the edges, and updating these messages by performing computations at the nodes based on the incoming messages. For example, each variable node 302 in the graph 300 may initially be provided with a "soft bit" (e.g., representing the received bit of the codeword) that indicates an estimate of the associated bit's value as determined by observations from the communications channel. Using these soft bits, the LDPC decoder may update messages by iteratively reading them (or some portion thereof) from memory and writing an updated message (or some portion thereof) back to memory. The update operations are typically based on the parity-check constraints of the corresponding LDPC code. For example, the LDPC decoder may update the soft bits associated with the codeword c to satisfy the equation: $h_p c^T=0$, where $h_p$ is the p$^{th}$ row of the parity-check matrix.

FIG. 4A shows an example of a layered decoding operation 400A. As shown in FIG. 4A, each b$^{th}$ layer of a corresponding parity-check matrix (H) contains the rows P·(b−1)+1 to P·b, thus each b$^{th}$ layer has a row weight $L_b$. In the layered decoding operation 400A, P denotes the size (e.g., number of rows) of a circulant sub-matrix in the parity-check matrix H, and B denotes the number of layers in the parity-check matrix H (e.g., B=(N−K)/P). Furthermore, $v_{l,p}^b$ denotes the log-likelihood ratio (LLR) of the l$^{th}$ variable node vnode$_{l,p}^b$ in the p$^{th}$ row of the b$^{th}$ layer of the parity-check matrix, and $V_{l,p}^b$ denotes the set of LLRs for all of the variable nodes vnode$_{l,p}^b$ that participate in the p$^{th}$ row of the b$^{th}$ layer of the parity-check matrix excluding $v_{l,p}^b$ (e.g., $V_{l,p}^b = V_{l,p}^b \setminus v_{l,p}^b$). The messages exchanged between check nodes and variable nodes are represented as "updates," where upd_vnode$_{l,p}^b$ denotes the update to the variable node vnode$_{l,p}^b$ in the p$^{th}$ row of the b$^{th}$ layer of the parity-check matrix.

In some implementations, a variable update rule of the layered decoding operation 400A may use a belief propagation algorithm. A belief propagation algorithm may include, for example, a sum-product algorithm, a min-sum algorithm, a scaled min-sum algorithm, a variable scaled min-sum algorithm, or any other suitable belief propagation algorithm. The examples described herein use a scaled min-sum algorithm for illustrative purposes only. In some implementations, the variable node update rule may perform lines 2 through 12 of the layered decoding operation 400A for each b$^{th}$ layer by processing the P consecutive rows of that layer.

Figure 4B:
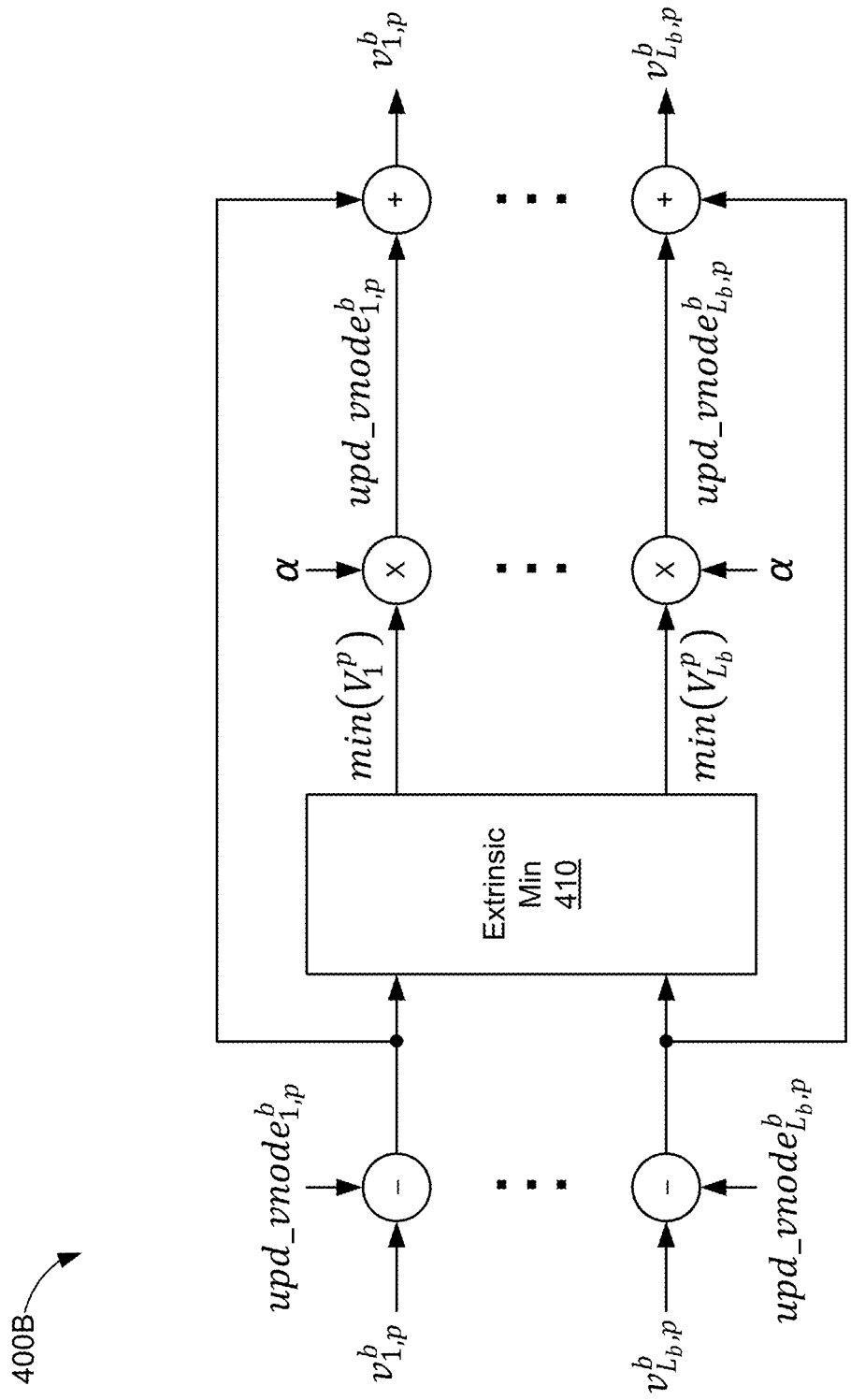
FIG. 4B is a block diagram of an example of a row processing unit for an LDPC decoder.

FIG. 4B is a block diagram of an example of a row processing unit 400B for an LDPC decoder. With reference for example to FIG. 4A, the row processing unit 400B may be configured to process and/or execute lines 3 through 11 of the layered decoding operation 400A for the p$^{th}$ row of the b$^{th}$ layer of a corresponding parity-check matrix. The row processing unit 400B receives, as its inputs, LLR values $v_{l,p}^b$ through $v_{L_b,p}^b$ (for vnode$_{1,p}^b$ through vnode$_{L_b,p}^b$, respectively). In some aspects, the LLR values $v_{l,p}^b$ may be obtained from a previous update (e.g., from another layer). Thus, the row processing unit 400B may first subtract the corresponding check node messages upd_vnode$_{1,p}^b$ through upd_vnode$_{L_b,p}^b$ from the LLR values $v_{1,p}^b$ through $v_{L_b,p}^b$, respectively (e.g., as described in line 4 of the layered decoding operation 400A).

An extrinsic minimum generator 410 may compute the extrinsic minimum values of the LLRs $v_{l,p}^b$ for each variable node index l, from 1 to $L_b$ (e.g., by computing $\min(|V_l^p|) \Pi \text{sign}(V_l^p)$ as described in line 7 of the layered decoding operation 400A). In the example of FIG. 4B, a scalar (α) is applied to the extrinsic minimum values $\min(|V_l^p|)$ through $\min(|V_{L_b,p}^b|)$ to generate scaled extrinsic minimum values, which correspond to updates upd_vnode$_{1,p}^b$ through upd_vnode$_{L_b,p}^b$ for the current layer being processed. The updates upd_vnode$_{1,p}^b$ through upd_vnode$_{L_b,p}^b$ are added to the LLR values $v_{1,p}^b$ through $v_{L_b,p}^b$, respectively, to produce updated LLR values $v_{l,p}^b$ (e.g., as described in line 10 of the layered decoding operation 400A) at the output of the row processing unit 400B. The updated LLR values $v_{1,p}^b$ through $v_{L_b,p}^b$ may then be stored in memory (not shown for simplicity), and may be used in a subsequent update of the layered decoding operation 400A.

It is noted that, the example row processing unit 400B may be scaled to simultaneously process P consecutive rows of a given layer of the parity-check matrix, for example, by operating a number (P) of the row processing units 400B in parallel. For example, a decoder architecture with 128 processors may be able to process one circulant having a size of up to P=128 per cycle. More specifically, it may take the decoder $L_b$ cycles to complete a single layer if P=128. However, if P≤64, the decoder may process multiple circulants (in parallel) in a single cycle of the decoding operation. For example, if 32<P≤64, the decoder may process 2 circulants in parallel per cycle. Further, if 2≤P≤32, the decoder may process 4 circulants in parallel per cycle. Thus, the number of parallel operations that may be performed by the decoder increases as the size of the circulant sub-matrix decreases, allowing a layer to be completed in less than $L_b$ cycles. On the other hand, if P>128, the decoder may process a single circulant over multiple cycles. For example, if 128<P≤256, the decoder may process one circulant in two cycles. Further, if 256<P≤384, the decoder may process one circulant in three cycles.

Aspects of the present disclosure recognize that the LDPC decoding circuitry may be reused to implement a wide range of LDPC codes by changing one or more parameters of the decoding circuitry. For example, an LDPC decoder that is configured for an LDPC code used in Wi-Fi communications (e.g., as defined by the IEEE 802.11 standards) may be dynamically reconfigured for an LDPC code used in 5G communications by changing one or more code definitions executed by the decoding circuitry. In some implementations, parity-check matrices for one or more LDPC codes may be stored, as a set of parameterized data (e.g., parity-check information), in an LDPC repository. More specifically, the parity-check information may describe various aspects or features of each parity-check matrix (such as codeword length, number of information bits, circulant size, number of layers, and the like). Thus, the LDPC decoder may be configured (or reconfigured) to implement a parity-check matrix associated with a new LDPC code by dynamically updating the parity-check information stored in the LDPC repository.

Figure 5A:
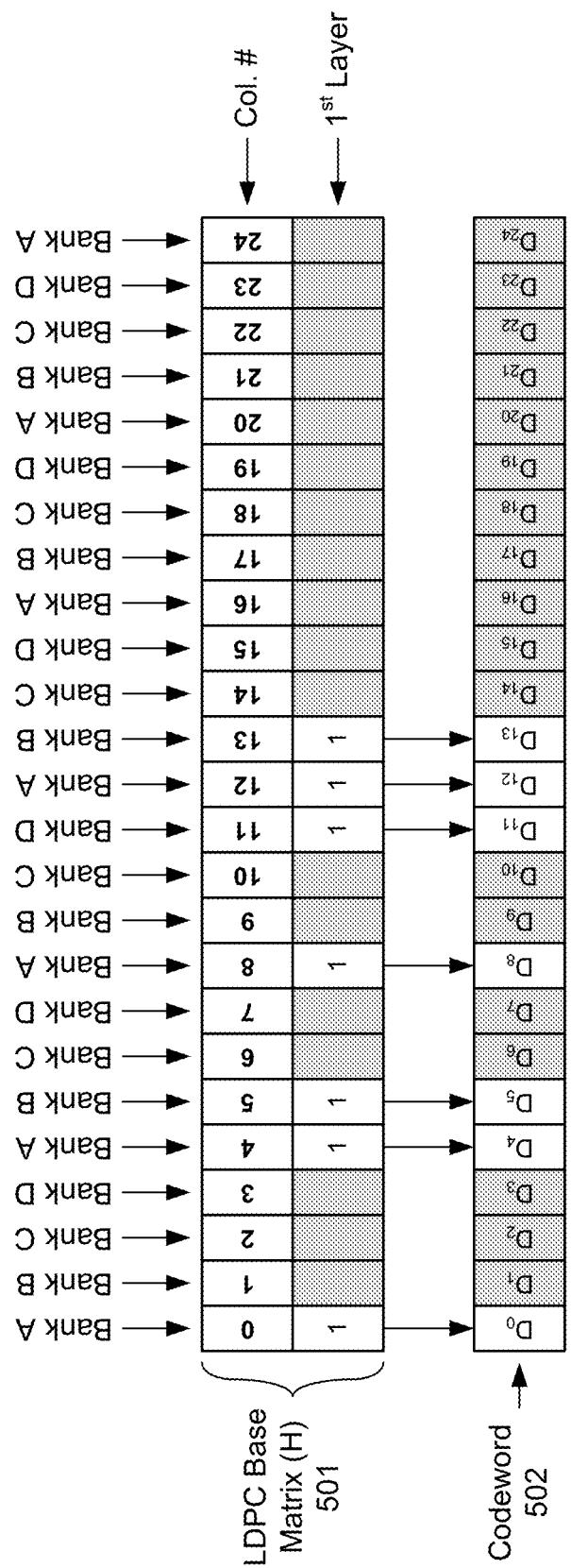
FIG. 5A shows an example of a base matrix (H) for an LDPC code and an associated codeword.

FIG. 5A shows an example of a base matrix (H) 501 for an LDPC code and an associated codeword 502. In some applications, the base matrix 501 may be associated with a QC LDPC code. In the example of FIG. 5A, only the first layer of the base matrix 501 is shown for simplicity. However, in actual implementations, the base matrix 501 may include more layers than those depicted in FIG. 5A. Each layer of the base matrix 501 is further subdivided into 25 columns (e.g., columns 0-24), and each column within a given layer may correspond with an all-zero submatrix (depicted as blank or empty rectangles) or a circulant submatrix (depicted as rectangles storing a value of "1"). As described above with respect to FIGS. 2A and 2B, an all-zero submatrix may be a P×P matrix in which all of the values are 0, and a circulant submatrix may be a P×P matrix in which each row and column contains a number of 1's equal to its circulant weight.

The codeword 502 may be encoded based on the QC LDPC code associated with the base matrix 501. Data in the codeword 502 may be arranged in a plurality of columns $D_0$-$D_{24}$. More specifically, each column of data (herein referred to as a "column") in the codeword 502 may be associated with a corresponding column of the base matrix 501. Each column of the codeword 502 is a sub-vector of the codeword and has P elements. Recall that P denotes the size (e.g., number of rows) of a circulant sub-matrix in the parity-check matrix H. For example, columns 0 through 24 of the base matrix 501 may correspond with columns $D_0$ through $D_{24}$, respectively, of the codeword 502. As shown in FIG. 5A, only selected columns of the codeword 502 participate in the decoding operation for each layer of the base matrix 501. The selected columns of the codeword 502 may coincide with respective column positions of circulant submatrices in the base matrix 501. For example, the first layer of the base matrix 501 includes a total of 7 circulant matrices located in columns 0, 4, 5, 8, 11, 12, and 13. Thus, only columns $D_0$, $D_4$, $D_5$, $D_8$, $D_{11}$, $D_{12}$, and $D_{13}$ of the codeword 502 may participate in the first layer of decoding. The codeword 502 has 25 sub-vectors of P elements, for a total of 25*P LLR elements.

Figures 5B, 5C:
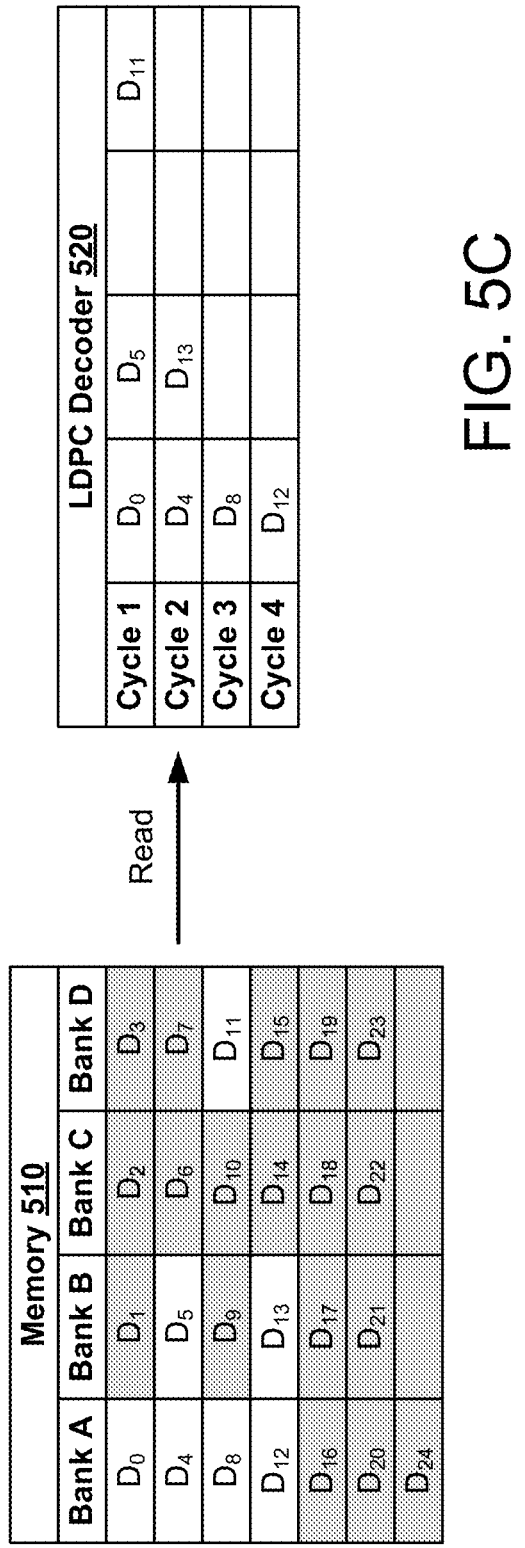
FIG. 5B shows an exemplary memory 510 configured to store the LDPC codeword depicted in FIG. 5A.
FIG. 5C shows an exemplary LDPC decoder circuit configured to process codewords stored in the memory depicted in FIG. 5B.

FIG. 5B shows an exemplary memory 510 configured to store the LDPC codeword 502 depicted in FIG. 5A. The memory 510 may include a plurality of memory banks A-D. In the example of FIG. 5B, only 4 memory banks A-D are shown for simplicity. However, in actual implementations, the memory 510 may include fewer or more memory banks than those depicted in FIG. 5B.

Each of the memory banks A-D may be configured to store one or more columns of the codeword 502. Each of the columns $D_0$-$D_{24}$ may be assigned to one of the memory banks A, B, C, or D based on an order of the columns in the codeword 502. For example, each of the columns $D_0$-$D_{24}$ may be stored upon receipt by the memory 510. Thus, the first four columns $D_0$, $D_1$, $D_2$, and $D_3$ may be assigned to memory banks A, B, C, and D, respectively. Thereafter, every four consecutive columns of the codeword 502 may be assigned to one of the memory banks A, B, C, or D in a round-robin fashion (e.g., as shown in FIG. 5A). In the example of FIG. 5B, memory bank A stores columns $D_0$, $D_4$, $D_8$, $D_{12}$, $D_{16}$, $D_{20}$, and $D_{24}$, memory bank B stores columns $D_1$, $D_5$, $D_9$, $D_{13}$, $D_{17}$, and $D_{21}$, memory bank C stores columns $D_2$, $D_6$, $D_{10}$, $D_{14}$, $D_{18}$, and $D_{22}$, and memory bank D stores columns $D_3$, $D_7$, $D_{11}$, $D_{15}$, $D_{19}$, and $D_{23}$.

FIG. 5C shows an exemplary LDPC decoder 520 configured to process codewords stored in the memory 510 depicted in FIG. 5B. The LDPC decoder 520 may be configured to read selected columns form the memory 510, and perform LDPC decoding on the selected columns using a layered decoding operation (e.g., as described above with respect to FIGS. 4A and 4B).

The LDPC decoder 520 may access the plurality of memory banks A-D in parallel. However, the LDPC decoder 520 may read only one column from each of the memory banks A-D at a given time. For example, during each cycle of the layered decoding operation, the LDPC decoder 520 may read up to one column from each of the memory banks A, B, C, and D. As shown in FIG. 5A, only columns $D_0$, $D_4$, $D_5$, $D_8$, $D_{11}$, $D_{12}$, and $D_{13}$ of the codeword 502 participate in the first layer of decoding. Moreover, as shown in FIG. 5B, columns $D_0$, $D_4$, $D_8$, and $D_{12}$ are stored in memory bank A, columns $D_5$ and $D_{13}$ are stored in memory bank B, and column $D_{11}$ is stored in memory bank D. Thus, the LDPC decoder 520 may read columns $D_0$, $D_5$, and $D_{11}$ from memory banks A, B, and D, respectively, during a first cycle of operation. The LDPC decoder 520 may read columns $D_4$ and $D_{13}$ from memory banks A and B, respectively, during a second cycle of operation. Since the remainder of the selected columns ($D_8$ and $D_{12}$) are all stored in memory bank A, the LDPC decoder 520 may read column $D_8$ during a third cycle of operation, and may read column $D_{12}$ during a fourth cycle of operation.

In the example of FIG. 5C, the LDPC decoder 520 may require four cycles to complete the first layer of decoding. Specifically, the number of cycles is limited by the number of columns stored in memory bank A that participate in the first layer of decoding. It is noted, however, that memory bank C does not store any of the columns that participate in the first layer of decoding. Thus, the number of cycles needed to complete the first layer of decoding may be reduced by moving one or more of the selected columns $D_0$, $D_4$, $D_8$, or $D_{12}$ from memory bank A to another memory bank (such as memory bank C or D). For example, moving columns $D_8$ and $D_{12}$ to memory bank C would substantially equalize the distribution of the selected columns across each of the memory banks A-D (e.g., memory banks A-C would each store 2 of the selected columns, and memory bank D would store 1 of the selected columns). This, in turn, would maximize the number of memory banks from which the LDPC decoder 520 may read during each cycle, and thus maximize the number of parallel decoding operations performed by the LDPC decoder 520 per cycle.

As described above, the memory 510 may be configured to store the columns of an LDPC codeword based, at least in part, on an order in which the columns are arranged in the received codeword.

Before commencing with the description of FIGS. 6-17, the following paragraphs explain how NOPs are employed during LDPC decoding. The distribution of a codeword across multiple memory banks and the bundling of instructions that specify circulant operations can lead to idle cycles for some parallel instances of LDPC decoder circuits. The idle cycles are triggered by "NOP" codes in the bundles of instructions. In the following discussion, the group of instructions that are processed in a single cycle is referred to as a "bundle." In implementations that make multiple parity check matrices available for different LDPC schemes and provide different sets of rotations and circulants for a particular parity check matrix, the storage requirements for instructions can be significant. As many of the instructions may be NOPs, much of the instruction storage may be wasted.

In an exemplary decoder architecture (not shown), 128 processors can process one circulant up to size P=128 per cycle. One instruction controls the processing per circulant.

Each instruction has multiple fields and multiple bits/field to indicate the associated column of the parity check matrix, a rotation value, whether the instruction specifies a NOP, and flags to indicate first use of a column or whether the instruction is associated with the last circulant of a column in the parity check matrix. In the exemplary architecture, $b_l$ cycles are required to complete processing of a layer according to $b_l$ instructions (i.e. the number of P=128 circulants in a layer). The 128-processor decoder architecture can also process circulants of up to P=512 over multiple cycles. For example, if P=256, then decoding requires two cycles per circulant and $2*b_l$ cycles per layer. In addition, if P≤64 then up to 2 circulants from the same layer can be processed per cycle, and if P≤32, up to 4 circulants can be processed per cycle, allowing a layer to be completed in fewer than $b_l$ cycles.

To allow multiple circulants to be processed per cycle, a memory arrangement includes four banks, with each sub-vector of an input codeword split across the banks according to the length, which is P, of the sub-vector. Each sub-vector, depending on the length, can be split into multiple segments, each segment having 32 elements of the sub-vector. Storage of the elements of a sub-vector in the memory banks is based on the length of the sub-vector and on the column of the parity check matrix associated with the sub-vector.

The memory banks in which elements of sub-vectors of different lengths are stored are illustrated in Table 1.

TABLE 1

| Packing Factor | bank 0 | bank 1 | bank 2 | bank 3 |
|---|---|---|---|---|
| 1 (64 < P ≤ 128) | elements 0-31 | elements 32-63 | elements 64-96 | elements 96-127 |
| 2 (32 < P ≤ 64) | elements 0-31 even columns | elements 32-63 even columns | elements 0-31 odd columns | elements 32-63 odd columns |
| 4 (2 < P ≤ 32) | elements 0-31 mod (col, 4) = 0 | elements 0-31 mod (col, 4) = 1 | elements 0-31 mod (col, 4) = 2 | elements 0-31 mod (col, 4) = 3 |

For 64<P≤128, a packing factor of 1 is assumed, and each sub-vector of an input codeword is split into four segments, and the elements of each segment are stored in one of memory banks 0, 1, 2, or 3. For 32<P≤64, a packing factor of 2 is assumed, and each sub-vector is split into two segments, and the elements of each segment are stored in one of two memory banks. The two memory banks (out of the four available memory banks) in which elements of a sub-vector are stored depend on whether the column number of the parity check matrix with which the sub-vector is associated is odd or even. Sub-vectors associated with even-numbered columns of the parity check matrix are split between banks 0 and 1, and sub-vectors associated with odd-numbered columns of the parity check matrix are split between banks 2 and 3. For 2<P≤32, a packing factor 4 is assumed, and input codeword sub-vectors 0, 1, 2, and 3 are stored in banks 0, 1, 2, 3 respectively, beginning at address 0 in the banks. The next four sub-vectors 4, 5, 6, and 7 are stored in banks 0, 1, 2, and 3, respectively, beginning at address 1 in the banks.

According to the memory layout of Table 1, instructions directing circulant operations are assembled in bundles of 1, 2 or 4 instructions, depending on the value of P. For example, if P=64, there are sufficient resources to process two submatrices. Operations on the even and odd columns of the parity check matrix can be performed together without contention on the same memory bank. With a packing factor of 2, for example, operations associated with two values of l can be simultaneously performed, providing that one set of the associated $v_{l,p}^b$ values resides in an odd-numbered column (one pair of banks) and the other set of associated values resides in an even-numbered column of the parity check matrix.

Table 2 shows a highly contrived parity check matrix that further illustrates packing of circulant operations. The parity check matrix in Table 2 has 4 circulants per layer. Each row of the parity check matrix represents a layer having P rows. If P=32, then each layer contains 32 rows, and the sub-vectors associated with the different columns are stored in separate banks as shown in Table 1 for a packing factor 4. Thus, 4 circulant operations on circulants of size P=32 can be performed in parallel by 128 processors. As separate banks are accessed, there is no contention when all are performed in the same cycle. Likewise for the second layer.

TABLE 2

| | | column | | | |
|---|---|---|---|---|---|
| | | 0 | 1 | 2 | 3 |
| row | 0 | 1 | 1 | 1 | 1 |
| | 1 | 1 | 1 | 1 | 1 |

The example considered in Table 2 is a simple base matrix where all columns are populated. This is not usually the case, and as a consequence packing the circulants in a layer in a way that avoids contention may not be possible. Thus, parts of the processing array may not be utilized on every cycle. For practical codes, such as the WiFi 802.11, size 648 half-rate code, utilization may be as low as 50%.

To address the possibility of contention, each instruction that defines a circulant operation contains a no-operation (NOP) field. In the 5G cellular mobile communications standard, codes have been defined that use the same base graph, but with a wide range of P. Implementation requirements dictate provision of instructions for all three packing factors (1, 2, and 4). The inclusion of NOPs increases the number of instructions required for a particular parity check matrix. For example, if the parity check matrix of Table 3 were used, with P=64, then packing of pairs of circulant operations is desired. However, packing of operations is available only for even and odd numbered columns, based on the mapping shown in Table 1. As such, two operations per cycle could be performed on layer 1, and on layer 2 only one operation per cycle would be performed and the other operation would be a NOP (i.e. on layer 0: column 1 and column 2 and then on layer 1: column 0 and then 2).

TABLE 3

| | | column | | | |
|---|---|---|---|---|---|
| | | 0 | 1 | 2 | 3 |
| row | 0 | 0 | 1 | 1 | 0 |
| | 1 | 1 | 0 | 1 | 0 |

The parity check matrix for base graph 1 of the 5G New Radio (NR) communications standards has 316 1's. Thus, 316 instructions would be required for 64<P. However, as P≤64 must also be supported, and as a result of the desired packing of instructions, the instruction count increases to 392 instructions when 32<P≤64, and to 536 instructions when P≤32. In total, 1244 instructions must be stored (316+392+536). Even if the NOP level was reduced, the presence of just 1 NOP requires that the instructions be unique to each packing factor, which would increase instruction storage by at least a factor of 3.

The introduction of NOPs also complicates the mapping between the instruction number and the address offset into a rotation table. For example, in the 5G NR communications standard there are 8 sets of rotations available for use, depending on the value of P. Storing the rotation separately and looking up the rotation based on the set that is required is more efficient than storing the rotation with the instruction. Without NOP instructions there is a one-to-one mapping between the instruction number and the offset address into the table of rotations. However, the introduction of NOPs removes this simple relationship, as there are more instructions than rotation values. To accommodate the mismatch, a 9-bit index is added to the instruction to index into the rotation table. The additional index increases the instruction width from 12 bits to 21 bits. Furthermore, additional cycles are required to perform the indirect look-up.

The disclosed circuits and methods eliminate explicit NOP instructions from the stored sets of instructions. Rather than storing explicit NOP instructions, the instruction format is modified to include information on where NOP instructions are to be introduced in the generated bundles of instructions. The stored instructions are read and the encoded NOP information is decoded to introduce NOP instructions in the bundles of instructions. As described above, a bundle can contain 1, 2 or 4 instructions for $64<P\leq128$, $32<P\leq64$ and $P\leq32$, respectively.

Instead of storing explicit NOP instructions for bundling, each instruction has additional bits (3 bits in the exemplary implementation), and the values of the bits are indicative of the number of instructions and the lsbs of the column of where the instructions are to be inserted in instruction bundles. In the exemplary implementation, two bits support packing four instructions in a bundle, and 1 bit supports packing two instructions in a bundle. The bits are indicative of the number of NOP instructions introduced in a bundle.

Figure 6:
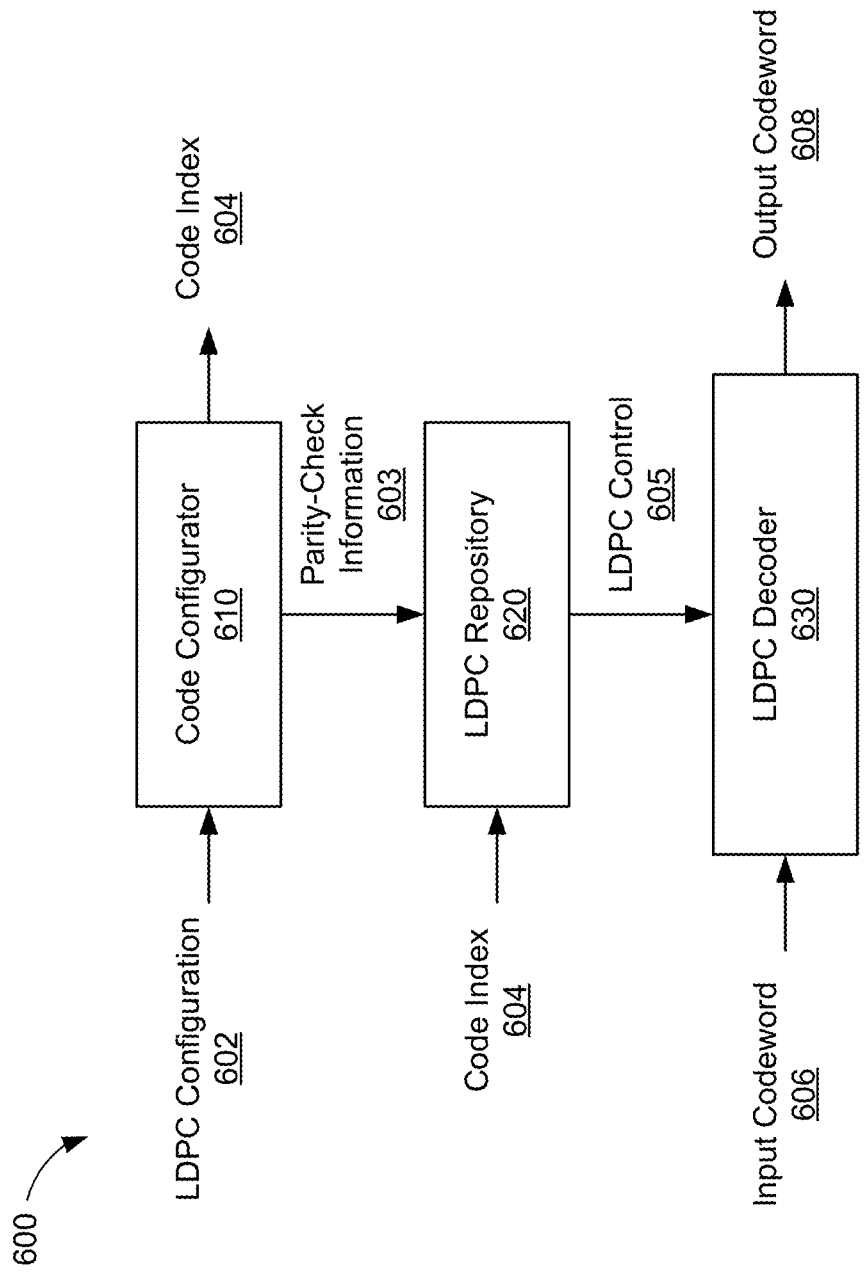
FIG. 6 is a block diagram of an exemplary programmable decoder circuit.

FIG. 6-17 illustrates aspects of LDPC decoding of an input code word following instructions that direct circulant operations and the use of encoded NOPs within the instructions. FIG. 6 is a block diagram of an exemplary programmable decoder circuit 600. In the example of FIG. 6, programmable decoder circuit 600 is configured to perform LDPC decoding operations. The decoder circuit 600 includes a code configurator 610, an LDPC repository 620, and an LDPC decoder 630. The decoder circuit 600 may be programmable to support a wide range of LDPC codes (including standardized and custom codes). More specifically, the decoder circuit 600 may be dynamically configured (and reconfigured) to perform LDPC decoding operations in accordance with various LDPC codes by reading and writing parity-check information to and from the LDPC repository 620.

The code configurator 610 may receive an LDPC configuration 602 describing a parity-check matrix for an LDPC code. For example, the LDPC configuration 602 may describe or otherwise indicate the bit values (e.g., "1" or "0") in each column and each row of the associated parity-check matrix, as well as the number of information bits and/or parity bits in each LDPC codeword associated with the parity-check matrix. The code configurator 610 may store the LDPC configuration 602 as a set of parameterized data (e.g., parity-check information 603) in the LDPC repository 620. In some aspects, the parity-check information 603 may provide a high-level description of the associated parity-check matrix (such as codeword length, number of information bits, circulant size, number of layers, and the like). The code configurator 610 may reuse or update at least some of the existing parity-check information in the LDPC repository 620 when storing the LDPC configuration 602. In some aspects, the code configurator 610 may further generate a code index 604 pointing to the storage location(s), in the LDPC repository 620, of the parity-check information 603 for the received LDPC configuration 602.

The LDPC repository 620 may store parity-check information for one or more LDPC codes. The parity-check information stored by the LDPC repository 620 may be dynamically updated to reflect different parity-check matrices (e.g., for new LDPC codes). The LDPC repository 620 may include a plurality of registers that are configured to store different parameters of each LDPC code. For example, aspects of the present disclosure recognize that multiple parity-check matrices may have at least some amount of parity-check information in common (such as the rotation of one or more circulant sub-matrices). Thus, one or more registers of the LDPC repository 620 may be shared or reused by multiple LDPC codes. As described above, the parity-check information associated with different LDPC codes may be indexed by the LDPC decoder 630. Thus, when configuring the decoder circuit 600 to implement a particular LDPC code, the LDPC repository 620 may receive an input specifying the code index 604 pointing to the storage location(s) associated with the LDPC code. The LDPC repository 620 provides bundles of instructions, depicted as LDPC control data 605 to the LDPC decoder 630 based on the received code index 604. In some aspects, the control data 605 may include at least some of the parity-check information 603 associated with the selected LDPC code.

The LDPC decoder 630 may read or receive the LDPC control data 605 from the LDPC repository 620. The LDPC decoder 630 may implement a parity-check matrix based on the received LDPC control data 605. The LDPC decoder 630 may further receive an input codeword 606 and decode the received codeword 606 using the parity-check matrix associated with the LDPC control data 605. For example, the LDPC decoder 630 may check each bit of the input codeword 606 against the parity-check matrix, update the values for the selected bits based on the parity-check operations, and output the bits (e.g., bits that have either passed or been corrected by the parity-check operations) as an output codeword 608. It is noted that, for proper decoding, the input codeword 606 and the parity-check matrix implemented by the LDPC decoder 630 should correspond to the same LDPC code. Thus, the LDPC decoder 630 may read or retrieve a particular set of LDPC control data 605 from the LDPC repository 620 based on the received input codeword 606. For example, a different code index 604 may be provided to the LDPC repository 620 for different input codewords 606 (e.g., depending on the LDPC code used to encode the codeword 606).

Figure 7A:
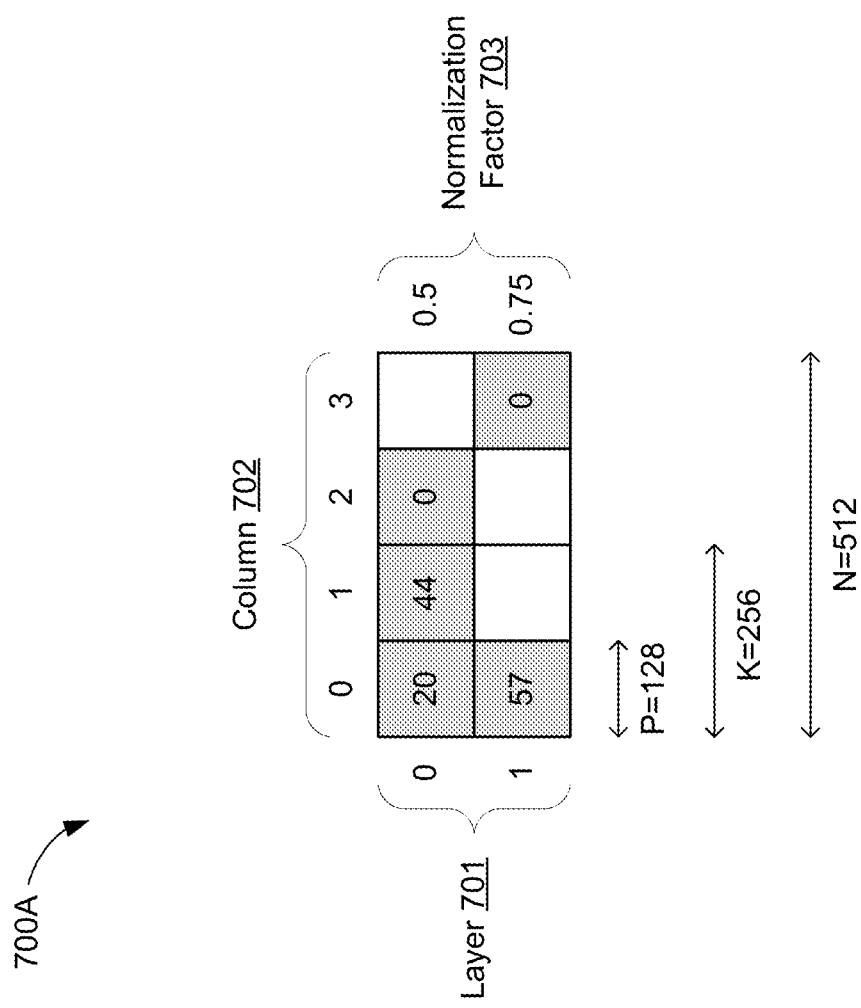
FIG. 7A shows an exemplary LDPC configuration for an LDPC base matrix (parity check matrix)

FIG. 7A shows an exemplary LDPC configuration for an LDPC base matrix (parity check matrix) 700A. The base matrix 700A may be associated with a QC LDPC code. The base matrix 700A includes a plurality of layers 701 (e.g., layers 0 and 1), each layer associated with a particular normalization factor 703 (e.g., 0.5 for layer 0 and 0.75 for layer 1). Each layer of the base matrix 700A is further subdivided into a plurality of columns 702 (e.g., columns 0-3), and each column within a given layer may correspond to an all-zero sub-matrix (depicted as a blank or empty square) or a circulant sub-matrix (depicted as a gray square with a numerical value inside). As described above with respect to FIGS. 2A and 2B, an all-zero sub-matrix may be a P×P matrix in which all of the values are 0 and a circulant sub-matrix may be a P×P matrix in which each row and column contains a number of 1's equal to its circulant weight.

The 1's in a circulant sub-matrix are arranged diagonally across the different layers, wrapping around in a circular fashion (e.g., from the last column to the first column of the sub-matrix). The numerical value inside each gray square indicates the rotation of the particular circulant. As used herein, the term "rotation" describes the initial offset of the diagonal of 1's. For any size rotation (r), the first 1 of the diagonal will reside in the $(r+1)^{th}$ column of the first row of the circulant. For example, when the rotation is equal to 0, the first 1 of the diagonal will reside in the first column of the first row of the circulant. On the other hand, when the rotation is equal to 1, the first 1 of the diagonal will reside in the second column of the first row of that circulant (e.g., as shown in FIG. 2B). With reference for example to FIG. 2C, the circulant sub-matrix 200C can be described by two rotations, including a first rotation equal to 1 (e.g., the first 1 of the first diagonal resides in the second column of the first row of the circulant) and a second rotation equal to 7 (e.g., the first 1 of the second diagonal resides in the eighth column of the first row of the circulant).

In the example of FIG. 7A, the first layer (e.g., layer 0) of the base matrix 700A has three circulant sub-matrices, including a first circulant having a rotation of size 20 (e.g., in column 0), a second circulant having a rotation of size 44 (e.g., in column 1), and a third circulant having a rotation of size 0 (e.g., in column 2). The second layer (e.g., layer 1) of the base matrix 700A has two circulant sub-matrices, including a first circulant having a rotation of size 57 (e.g., in column 0) and a second circulant having a rotation of size 0 (e.g., in column 3). Each circulant sub-matrix comprises 128 rows and 128 columns (e.g., P=128). The base matrix 700A may be used to decode 512-bit LDPC codewords (e.g., N=512) in which only 256 bits are information bits (e.g., K=256). Thus, the remaining 256 bits of each LDPC codeword are parity bits.

Figure 7B:
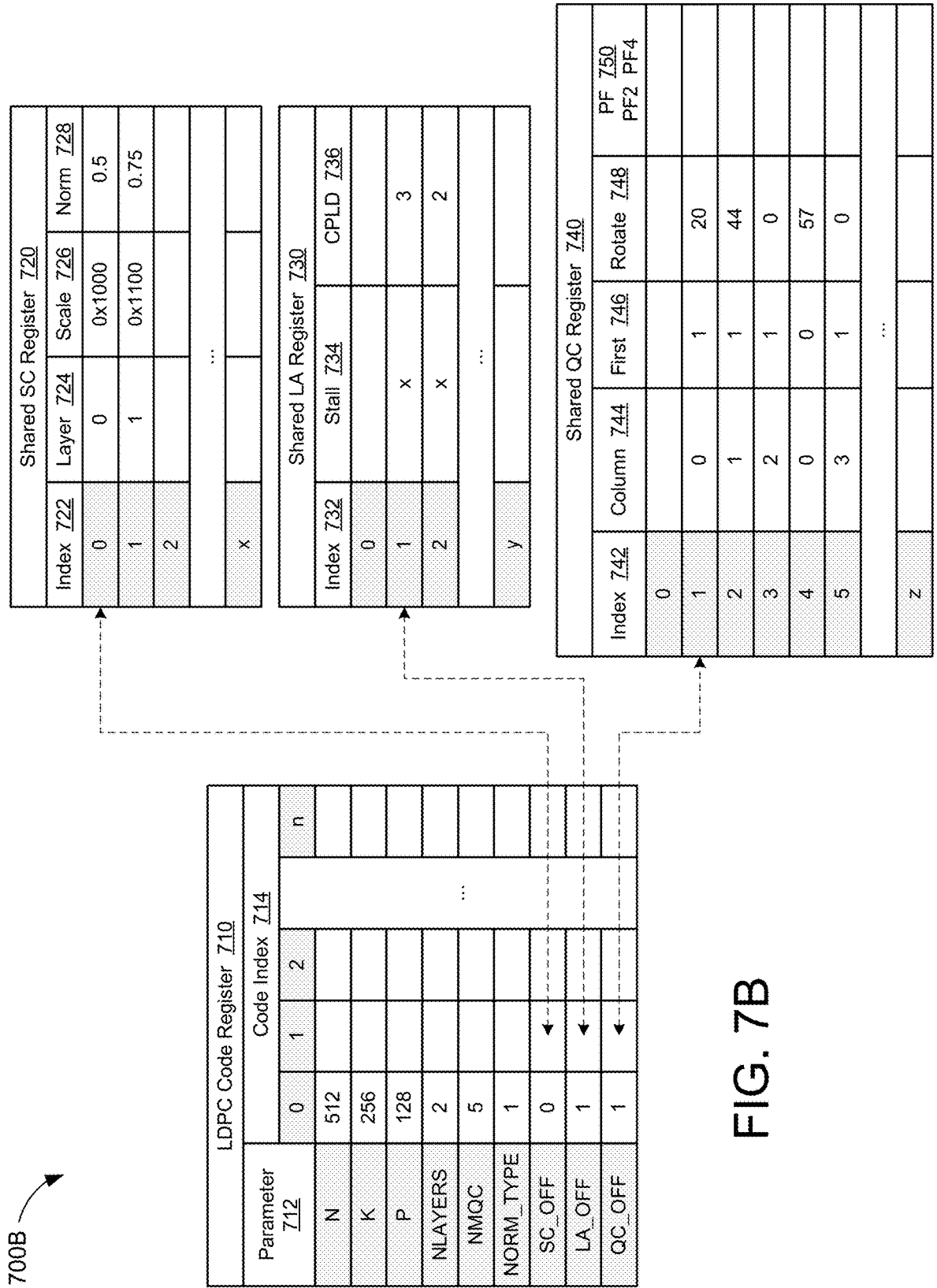
FIG. 7B shows an exemplary configuration of storage circuits of an LDPC repository.

FIG. 7B shows an exemplary configuration of storage circuits of an LDPC repository 700B. The LDPC repository 700B may represent an example configuration of the LDPC repository 620 of FIG. 6. The LDPC repository 700B may be configured to store parity-check information describing parity-check matrices for one or more LDPC codes. In some aspects, at least some of the parity-check information stored in the LDPC repository 700B may be specific or unique to a particular LDPC code. In some other aspects, at least some of the parity-check information stored in the LDPC repository 700B may be common or shared among multiple LDPC codes. In the example of FIG. 7B, the LDPC repository 700B includes an LDPC code register 710, a shared scaling factor (SC) register 720, a shared layer (LA) register 730, and a shared circulant (QC) register 740.

The LDPC code register 710 may be configured to store code-specific parameters for one or more LDPC codes. Each row of the LDPC code register 710 may be associated with a different parameter 712 of the LDPC code. Example parameters 712 include, but are not limited to, the number of codeword bits (N), the number of information bits (K), the size of each sub-matrix (P), the number of layers in the base matrix (NLAYERS), the total number of circulant operations in the base matrix (NMQC), and whether normalization is to be applied (NORM_TYPE). In some implementations, N and K may be captured as multiples ($N_b$ and $K_b$, respectively) of P (e.g., where $N=P*N_b$ and $K=P*K_b$). Thus, P may be provided as an input along with the codeword data. As described in greater detail below, the parameters 712 may also include pointers to one or more shared registers. For example, the LDPC code register 710 may store a pointer to the shared SC register 720 (SC_OFF), a pointer to the shared LA register 730 (LA_OFF), and/or a pointer to the shared QC register 730 (QC_OFF). Each column of the LDPC code register 710 may be associated with a different code index 714. For example, the code-specific parameters for a particular LDPC code may be stored in the appropriate rows for the given index (e.g., 0-n). In the example of FIG. 7B, the rows associated with index 0 of the LDPC code register 710 are populated with parity-check information describing the base matrix 700A of FIG. 7A.

The shared SC register 720 may be configured to store the normalization factor to be applied to the processing of each layer of the base matrix. Data in the shared SC register 720 may be organized in a plurality of columns 722-728. The first column stores an SC index 722 for a corresponding set of scaling factors. The second column stores layer information 724 indicating the layer of the base matrix associated with a particular scaling factor. The third column stores scaling information 726 indicating a scale value (e.g., 0-15) to be used for generating each scaling factor. The fourth column stores normalization information 728 indicating the scaling factor ($\alpha$) to be applied to each layer of the base matrix (e.g., $\alpha=1$ when scale value is 0; and $\alpha=0.0625*$ [scale value] when scale value is any number between 1-15). The parity-check information stored by the SC register 720 may be shared or reused by multiple LDPC codes. For example, two or more LDPC codes stored in the LDPC code register 710 may use the same scaling factors, and may thus point to the same SC index 722 in the shared SC register 720.

The shared LA register 730 may be configured to store layer information describing the number of operations to be performed on each layer of the base matrix. Data in the shared LA register 730 may be organized in a plurality of columns 732-736. The first column stores an LA index 732 for a corresponding set of layer information. The second column stores a stall value 734 indicating the number of cycles (e.g., 0-255) to wait at the start of a layer to enforce data dependencies. For example, data dependencies often exist between layers and/or iterations of an LDPC decoding operation. To enforce such data dependencies, it may be desirable to ensure that at least a threshold amount of time has elapsed (e.g., corresponding to the stall value) between successive memory accesses to the same data. The third column of the LA register 730 stores a CPLD value 736 indicating the number of processing cycles per layer. It is noted that the number of circulant operations that can be performed in each of the cycles may depend on the packing factor (e.g., as described in greater detail below). The parity-check information stored by the LA register 730 may be shared or reused by multiple LDPC codes. For example, two or more LDPC codes stored in the LDPC code register 710 may use the same layer information, and may thus point to the same LA index 732 in the shared LA register 730.

The shared QC register 740 may be configured to store circulant information describing one or more circulant sub-matrices included in the base matrix. Data in the shared QC register 740 may be organized in a plurality of columns 742-748. The first column stores a QC index 742 for a corresponding set of circulants. The second column stores column information 744 indicating the column of the base matrix in which a particular circulant can be found. The third column stores a first-use value 746 indicating whether the corresponding column of the base matrix is being used or accessed for the first time in the decoding operation. The fourth column stores rotation information 748 indicating the size of the rotation of the corresponding circulant sub-matrix. The parity-check information stored by the QC register 740 may be shared or reused by multiple LDPC codes. For example, two or more LDPC codes stored in the LDPC code register 710 may use the same circulant information, and may thus point to the same QC index 742 in the shared QC register 740.

The QC register can store different sets of circulant information that correspond to different LDPC codes. The set of circulant information that corresponds an LDPC code is a set of instructions that specify the circulant operations to be performed on the input codeword using the referenced circulants. Each row in the shared QC register represents an instruction that specifies circulant operation. The shared QC register 740 further includes a PF (packing factor) column 750. The PF field in each instruction indicates the number of non-NOP instructions to include in a bundle for each packing factors 2 and 4, for example. Slots in a bundle not filled by non-NOP instructions are impliedly NOP instructions. Thus, the specification of the number of non-NOP instructions in the PF field indirectly indicates the number of NOP instructions in the bundle. One bit (PF2) can be used for a packing factor of 2, as at most 2 instructions can be inserted in a bundle. Two bits can be used for a packing factor of 4, as at most 4 instructions can be inserted in a bundle. The special value 0 can direct reading from the stored instruction set the maximum number of instructions that can be packed into a bundle (e.g., 2 or 4 non-NOP instructions depending upon packing factor).

It is noted that the configuration shown in FIG. 7B provides significant flexibility in the way LDPC codes are stored and/or accessed in the LDPC register 700B. For example, the parity-check information stored in one or more of the shared registers 720-740 may be reused to support different code rates and/or codeword sizes. In some aspects, the size of the sub-matrix (e.g., in the LPDC code register 710) may be modified to support different codeword sizes at the same code rate. For example, the N, K, and/or P parameters associated with a particular code index may be changed while maintaining the same pointer values SC_OFF, LA_OFF, and QC_OFF. In some other aspects, a portion of the base matrix may be reused to support different codeword sizes and rates for the same number of information bits (K). For example, it may be possible to reduce the number of columns in a particular base matrix by reducing the number of layer (NLAYERS) and the codeword length (N) while maintaining the same pointer values SC_OFF, LA_OFF, and QC_OFF. This may result in an increase in code rate as the number of parity bits and codeword size is reduced. Still further, in some aspects, a portion of the base matrix may be reused to support different code rates for the same codeword size. For example, it may be possible to reduce the number of layers (NLAYERS) to increase the number of information bits (K) at a constant codeword length (N) by adjusting the pointer values SC_OFF, LA_OFF, and QC_OFF (and adjusting NLAYERS and K).

Figure 8:
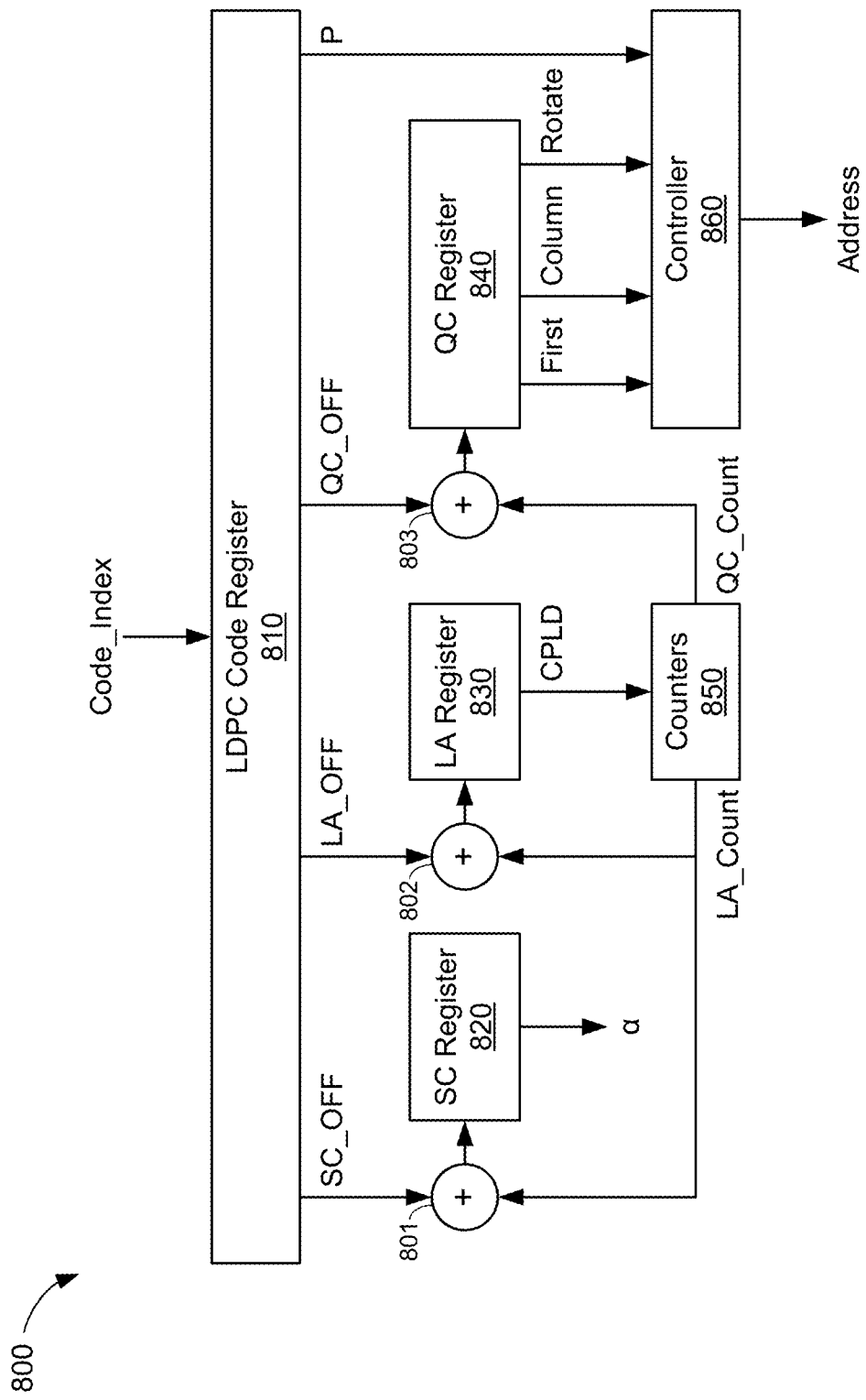
FIG. 8 is a block diagram of an exemplary LDPC repository.

FIG. 8 is a block diagram of an exemplary LDPC repository 800. The LDPC repository 800 may be an exemplary implementation of the LDPC repository 620 of FIG. 6. In some implementations, the LDPC repository 800 may be configured to store parity-check information describing parity-check matrices for one or more LDPC codes. More specifically, the LDPC repository 800 may generate a set of LDPC control data, to control a decoding operation of a programmable LDPC decoder, for a selected LDPC code. The LDPC control data may enable the programmable LDPC decoder to decode an LDPC codeword using a parity-check matrix associated with the LDPC code used to encode the LDPC codeword.

The LDPC repository 800 includes an LDPC code register 810, an SC register 820, an LA register 830, and a QC register 840. The LDPC code register 810 may be configured according to the LDPC code register 710 of FIG. 7B. Thus, the LDPC code register 710 may be configured to store code-specific parameters for one or more LDPC codes (e.g., N, K, P, NLAYERS, NMQC, and NORM_TYPE) and pointers to one or more shared registers (e.g., SC_OFF, LA_OFF, and QC_OFF). The SC register 820 may be configured according to the shared SC register 720 of FIG. 7B. Thus, the SC register 820 may be configured to store the normalization factor (a) to be applied to the processing of each layer of the base matrix. The LA register 830 may be configured according to the shared LA register 730 of FIG. 7B. Thus, the LA register 830 may be configured to store layer information (e.g., CPLD) describing the number of processing cycles to be performed on each layer of the base matrix. The QC register 840 may be configured according to the shared QC register 740 of FIG. 7B. Thus, the QC register 840 may be configured to store circulant information (e.g., First, Column, Rotate) describing one or more circulant sub-matrices included in the base matrix.

In some implementations, the LDPC repository 800 may include additional circuitry for retrieving or reading the LDPC control data from the registers 810-840. For example, the additional circuitry may include a set of counters 850, a controller 860, and a plurality of adders 801-803. The adders 801-803 may be coupled to the registers 820-840, respectively, to retrieve shared parity-check information associated with a selected LDPC code. For example, the LDPC code register 810 may receive a code index (Code_Index) identifying a particular parity-check matrix stored in the LDPC repository 800. The LDPC code register 810 may output a set of parameters associated with the corresponding code index. For example, the parameters may include the sub-matrix size (P) and pointers to respective registers 820-840 (SC_OFF, LA_OFF, and QC_OFF).

The counters 850 may generate a layer count value (LA_Count) and a circulant count value (QC_Count) based, at least in part, on the number of processing cycles to be performed on each layer of the base matrix (CPLD). More specifically, LA_Count may be used to increment the pointers to the SC register 820 and LA register 830 by adding the LA_Count value to SC_OFF and LA_OFF, respectively, via the adders 801 and 802. Moreover, QC_Count may be used to increment the pointer to the QC register 840 by adding the QC_Count value to QC_OFF via the adder 803. The counters 850 may be initialized to a count value of zero (e.g., LA_Count=0 and QC_Count=0). The counters 850 may increment LA_Count to retrieve, from the SC register 820, the scaling factor (α) associated with each layer of the base matrix and to retrieve, from the LA register 830, the number of processing cycles to be performed (CPLD) on each layer of the base matrix. the counters 850 may further increment QC_Count to retrieve, from the QC register 840, the circulant information (First, Column, Rotate, and PF) for each layer of the base matrix. In some aspects, the counter 850 may determine when to increment LA_Count based on the current QC_Count value and the CPLD information output by the LA register 830. For example, the counter 850 may increment LA_Count once the QC_Count value is equal to the total number of count values for the current layer (e.g., as indicated by CPLD).

The controller 860 may generate a memory address (Address) based, at least in part, on the circulant information output by the QC register 840 and one or more LDPC code parameters output by the LDPC code register 810. For example, the controller 860 may determine the location in memory at which a selected portion of the LDPC codeword is stored. The selected portion may coincide with the column(s) of the LDPC codeword to participate in the current processing cycle of the LDPC decoding operation. The controller 860 may determine the memory address of the selected portion of the LDPC codeword based, at least in part, on the sub-matrix size (P) and the column of the base matrix in which a corresponding circulant is located (Column). In some aspects, the controller 860 may retrieve additional information (not shown for simplicity) from the LDPC code register 810 for determining the memory address. Such additional information may include, for example, a parameter indicating the number of M-size vectors in the codeword (N) accounting for sub-matrix size (P) and packing.

Figure 9:
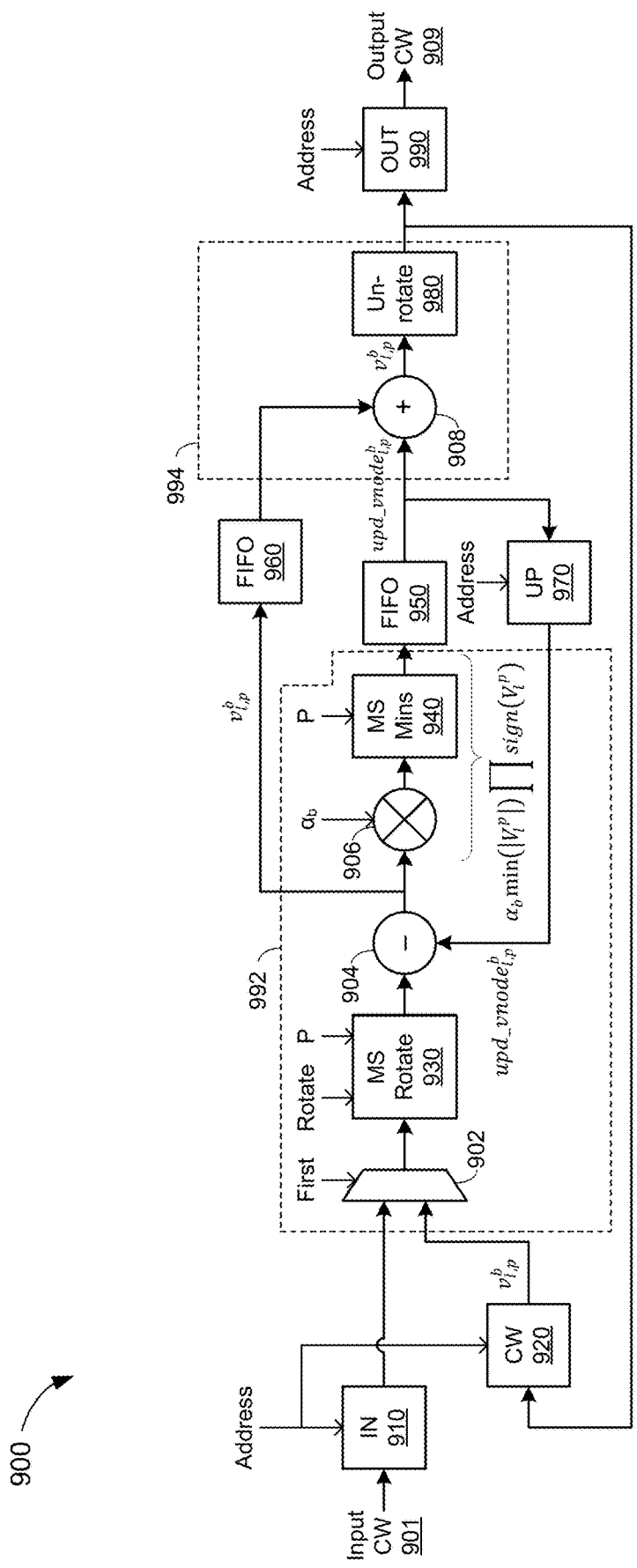
FIG. 9 is a block diagram of a programmable LDPC decoder.

FIG. 9 is a block diagram of a programmable LDPC decoder 900. The programmable LDPC decoder 900 may be an exemplary implementation of the LDPC decoder 630 of FIG. 6. The LDPC decoder 900 may be dynamically configured (and reconfigured) to perform LDPC decoding operations in accordance with one or more LDPC codes stored in an LDPC repository (such as the LDPC repository 900 of FIG. 9). For example, the LDPC decoder 900 may implement a parity-check matrix associated with a selected LDPC code based on LDPC control data provided by the LDPC repository. The LDPC decoder 900 may be configured to process multiple circulants of the parity-check matrix in parallel. For example, the LDPC decoder 900 may pack multiple circulant operations into a single processing cycle (e.g., clock cycle).

The LDPC decoder 900 includes an input (IN) buffer 910, a codeword (CW) buffer 920, a multi-size (MS) rotator 930, an MS minimum generator 940, first-in first-out (FIFO) buffers 950 and 960, an update (UP) buffer 970, an unrotator 980, and an output (OUT) buffer 990. The buffers 910, 920, 970, and 990 may correspond to random access memory (RAM). However, in actual implementations, any type of data storage device may be used to implement the buffers 910, 920, 970, and 990. In some implementations, the buffers 910, 920, 970, and/or 990 may be combined in various ways. For example, in some aspects, the input buffer 910, CW buffer 920, and/or output buffer 990 may be combined to reduce the amount of time spent reading and writing input and output data between the buffers.

The input buffer 910 may receive and store an input codeword (CW) 901 to be decoded. Each bit of the input codeword 901 may be represented by a log-likelihood ratio (LLR):

$$LLR(x) = \ln\left(\frac{Pr(x=1)}{Pr(x=0)}\right)$$

where Pr(x=1) is the probability that a particular bit (x) of the input codeword 901 is 1 and Pr(x=0) is the probability that the particular bit (x) of the input codeword 901 is 0. Thus, negative LLR values may be interpreted as a hard binary "0" value and positive LLR values (and LLR=0) may be interpreted as a hard binary "1" value. It is noted that, in other implementations, negative LLR values may be interpreted as a hard binary "1" value and positive LLR values (and LLR=0) may be interpreted as a hard binary "0" value.

In some implementations, one or more of the buffers 910, 920, and/or 990 may be partitioned into a number (NMB) of memory banks to enable parallel decoding operations to be performed on LLRs associated with multiple columns of the input codeword 901. For example, the width of the input buffer 910 may be equal to a number (M) of LLRs. Thus, each individual memory bank may have a width equal to m, where m=M/NMB. In some aspects, the LLRs of the input codeword 901 may be stored across the plurality of memory banks in a round-robin fashion. During each processing cycle of the LDPC decoding operation, each memory bank may output up to m LLRs (e.g., for a maximum of M LLRs that can be output in parallel by the input buffer 910). For example, if the input buffer 910 is partitioned into 4 memory banks (NMB=4) with a combined width equal to 128 LLRs (M=128), the input buffer 910 may be configured to output either 1 column (e.g., P=128), 2 columns (e.g., P=64), or 4 columns (e.g., P=32) of the input codeword in parallel. Accordingly, the partitioning of the input buffer 910 (e.g., into a plurality of memory banks) may facilitate the processing of multiple circulants of the parity-check matrix in parallel (e.g., in a single processing cycle).

At runtime, the input buffer 910 may receive LDPC control data (e.g., Address) from the LDPC repository indicating the memory addresses of selected LLRs that participate in the current layer of decoding. The selected LLRs may be provided as inputs to a multiplexer 902 which selectively outputs the LLRs from the input buffer 910 (or a set of LLRs from the codeword buffer 920) to the MS rotator 930 based on LDPC control data (e.g., First) received from the LDPC repository. In some implementations, the multiplexer 902 may output the LLRs from the input buffer 910 only if the LLRs are being used for the first time in the decoding operation (e.g., First=1). For any subsequent circulant operations performed on the same set of the LLRs within the same layer (e.g., First=0), the multiplexer 902 may output updated LLR values from the CW buffer 920 instead. In some other implementations, the multiplexer 902 may output the LLRs from the input buffer 910 for each of the circulant operations (e.g., when the CW buffer 920 is combined or integrated with the input buffer 910).

The MS rotator 930 receives the LLRs from the multiplexer 902 and rotates the received LLRs based on LDPC control data (e.g., Rotate and P) received from the LDPC repository. For example, the MS rotator 930 may shift or rotate the LLRs stored in memory to coincide with the rotation(s) of the circulant sub-matrices to be applied in the current processing cycle (e.g., so that the circulant operations can be performed on the LLRs in the correct order). The MS rotator 930 may determine the size of the rotation(s) to be applied to the LLRs based at least in part on the rotation (e.g., Rotate) and sub-matrix size (e.g., P) of the circulants. In some implementations, the MS rotator 930 may be configured to perform multiple rotations, concurrently, on the received LLRs based on the number of circulants that are packed into the current processing cycle. For example, when the LDPC decoder 900 is configured to perform 2 circulant operations in parallel (e.g., where at least some of the hardware of the LDPC decoder 900 is reused), the MS rotator 930 may perform 2 concurrent rotations (e.g., performing a different rotation on each subset of LLRs) on the LLRs received from the multiplexer 902. Similarly, when the LDPC decoder 900 is configured to perform 4 circulant operations in parallel, the MS rotator 930 may perform 4 concurrent rotations on the LLRs received form the multiplexer 902. Accordingly, the MS rotator 930 may further facilitate the processing of multiple circulants of the parity-check matrix in parallel (e.g., in a single processing cycle).

The rotated LLRs may be combined, by a subtractor circuit 904, with update messages (e.g., upd_vnode$_{l,p}^b$) from the update buffer 970. It is noted that each of the update messages upd_vnode$_{l,p}^b$ may correspond to respective updates upd_vnode$_{l,p}^b$ of FIGS. 4A and 4B. More specifically, the subtractor circuit 904 may subtract the update messages upd_vnode$_{l,p}^b$ from the LLRs v$_{l,p}^b$ (e.g., as described in line 4 of the layered decoding operation 400A of FIG. 4A). In some aspects, the resulting LLRs v$_{l,p}^b$ may be buffered by the FIFO 960. In some other aspects, the MS minimum generator 940 may compute the extrinsic minimum values of the LLRs v$_{l,p}^b$ (e.g., by computing min($|V_i^p|$) Πsign($V_i^p$) as described in line 7 of the layered decoding operation 400A of FIG. 4A). The MS minimum generator 940 may be configured to compute multiple extrinsic minimum values, concurrently, for different sets of LLRs based on the number of circulants that are packed into the current processing cycle. Accordingly, the MS minimum generator 940 may further facilitate the processing of multiple circulants of the parity-check matrix in parallel (e.g., in a single processing cycle). In some aspects, a multiplier 906 may apply a scaling factor ($\alpha_b$) to the extrinsic minimum values min($|V_i^p|$) to generate scaled extrinsic minimum values, which correspond to update messages upd_vnode$_{l,p}^b$ for the current layer being processed.

The update messages upd_vnode$_{l,p}^b$ output by the MS minimum generator 940 may be buffered by the FIFO 950. The FIFO 950 may be configured to store (for each layer) sign($V_i^p$), the Πsign($V_i^p$), and the two lowest "minima" calculated for min($|V_i^p|$). For example, the first minimum may correspond to the lowest magnitude calculated across all $V_i^p$ and the second minimum may correspond to the second-lowest magnitude calculated across all $V_i^p$. Aspects of the present disclosure recognize that the magnitude of upd_vnode$_i^p$ may correspond to the first minimum or the second minimum, depending on whether the value $V_i^p$ excluded from the min-sum calculation corresponds to the first minimum. Thus, upd_vnode$_{l,p}^b$ may be reconstructed at the output of the FIFO 950 based on the values stored for each layer. For example, the sign of upd_vnode$_{l,p}^b$ may be determined based on the product of sign($V_i^p$) and Πsign ($V_i^P$), and the magnitude of upd_vnode$_{l,p}^b$ may correspond to the first minimum or the second minimum stored therein (e.g., depending on the value $V_i^p$ excluded from the min-sum calculation). The MS minimum generator or all the circuits of the LDPC decoder 900 can be disabled in response to a NOP instruction.

In some aspects, the FIFO 950 may output the update messages upd_vnode$_{l,p}^b$ to the update buffer 970, where the update messages upd_vnode$_{l,p}^b$ are subsequently stored (e.g., for use in the next layer of the decoding operation). In some other aspects, the update messages upd_vnode$_{l,p}^b$ may be combined, by an adder circuit 908, with the LLRs v$_{l,p}^b$ from the FIFO 960, and the updated LLRs v$_{l,p}^b$ may be rotated by the un-rotator 980. More specifically, the adder circuit 908 may add the update messages upd_vnode$_{l,p}^b$ to the LLRs v$_{l,p}^b$ (e.g., as described in line 10 of the layered decoding operation 400A of FIG. 4A). The un-rotator 980 may undo the rotation applied by the MS rotator 930 so that the resulting LLRs v$_{l,p}^b$ can be returned to memory in their original positions. In some implementations, the un-rotator 980 may be bypassed or excluded from the LDPC decoder 900. In some aspects, the resulting LLRs v$_{l,p}^b$ may be stored in the codeword buffer 920 (e.g., for use in the next layer of the decoding operation). In some other aspects, the resulting LLRs v$_{l,p}^b$ may be stored in the output buffer 990 to be combined into an output codeword 909. The output buffer 990 may receive LDPC control data (e.g., Address) from the LDPC repository indicating the memory addresses of selected LLRs stored in the output buffer 990. The selected LLRs may be output from the output buffer 990 as the output codeword 909.

It is noted that, in some implementations, one or more circulants of a base matrix may have a circulant weight greater than 1 (e.g., as shown in FIG. 2C). In such implementations, data dependencies may exist between the update messages in a particular layer. As such, the layered decoding operation described above (e.g., with reference to FIG. 4A) may not be implemented by processing the P rows of a particular layer in parallel. However, aspects of the present disclosure recognize that, by computing row updates for each row and storing the row updates in a storage element, a layer update operation may be performed using the stored row updates for sub-matrices having circulant weights greater than 1 in the P rows. This allows the row updates to be performed in parallel. More specifically, the P rows of the same layer may be processed in parallel despite the data dependencies between the P rows.

In the example of FIG. 9, for purposes of illustration, a bounding box 992 indicates a portion of the programmable LDPC decoder 900 that may be referred to as a first stage. The first stage, which also may be referred to as the "Mins Loop," generally corresponds to lines 3-5 and 6-8 of FIG. 4A. Bounding box 994 indicates another portion of the programmable LDPC decoder 900 that may be referred to as a second stage. The second stage, which also may be referred to as the "Update Loop," generally corresponds to lines 9-11 of FIG. 4A.

Figure 10:
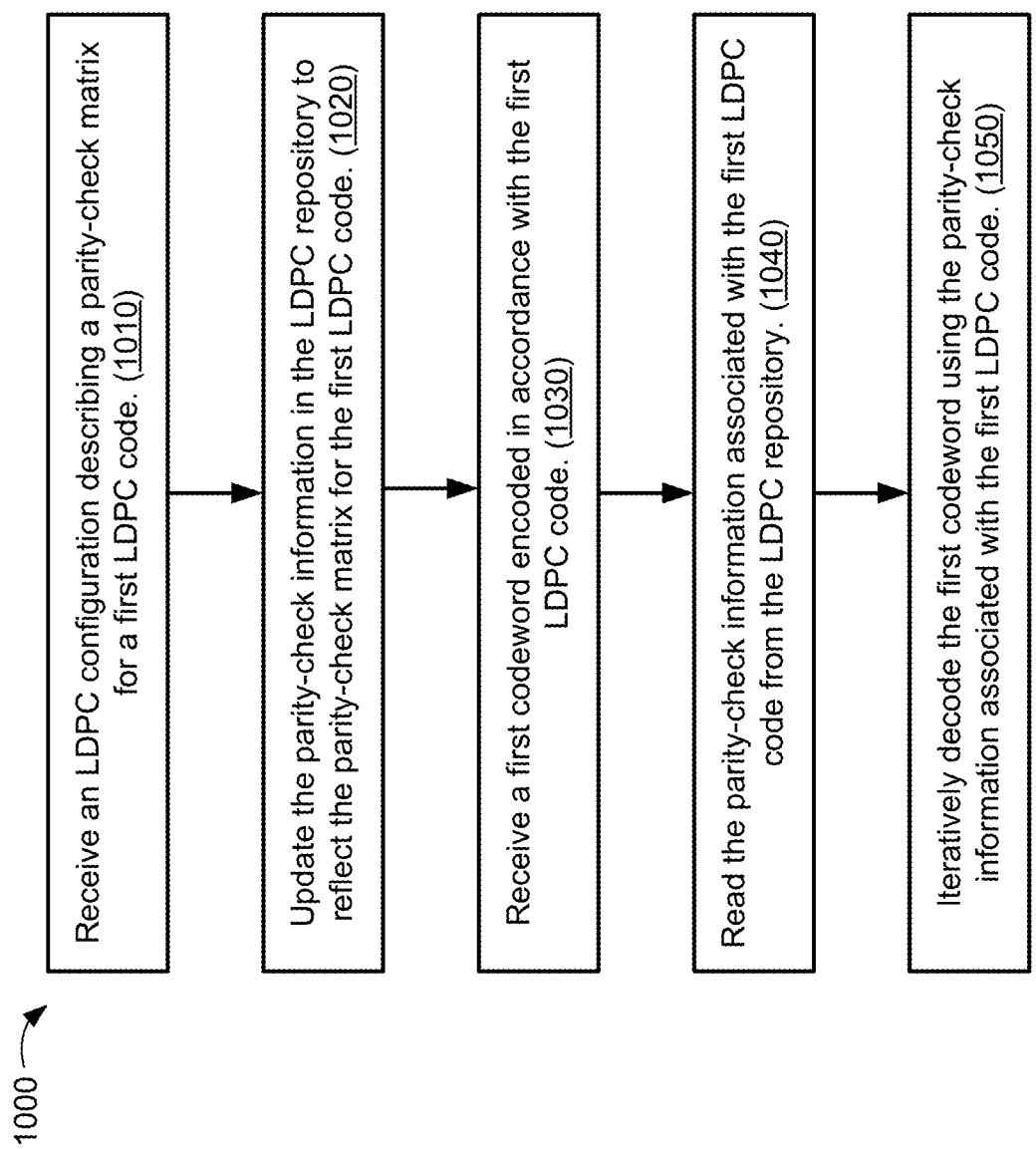
FIG. 10 is an illustrative flow chart depicting an exemplary operation of a programmable LDPC decoder.

FIG. 10 is an illustrative flow chart depicting an exemplary operation 1000 of a programmable LDPC decoder. Although described below with respect to the decoder circuit 600 of FIG. 6, the example operation 1000 may be performed by any suitable decoder circuit.

The decoder circuit 600 may receive an LDPC configuration describing a parity-check matrix for a first LDPC code (1010). For example, the decoder circuit 600 may receive an LDPC configuration describing a parity-check matrix for an LDPC code. The LDPC configuration may describe or otherwise indicate the bit values (e.g., "1" or "0") in each column and each row of the associated parity-check matrix, as well as the number of information bits and/or parity bits in each LDPC codeword associated with the parity-check matrix.

The decoder circuit 600 may then update the parity-check information in the LDPC repository to reflect the parity-check matrix for the first LDPC code (1020). For example, the decoder circuit 600 may store the LDPC configuration as a set of parameterized data (e.g., parity-check information) in the LDPC repository. In some aspects, the parity-check information may provide a high-level description of the associated parity-check matrix (such as codeword length, number of information bits, circulant size, number of layers, and the like).

The decoder circuit 600 may further receive a first codeword encoded in accordance with the first LDPC code (1030). For example, the decoder circuit 600 may implement a parity-check matrix based on the parity-check information stored in the LDPC repository. In some implementations, the decoder circuit 600 may use the parity-check matrix to decode the received codeword.

The decoder circuit 600 may then read the parity-check information associated with the first LDPC code from the LDPC repository (1040). The decoder circuit 600 may read or retrieve a particular set of parity-check information from the LDPC repository based on the received input codeword. For example, a different code index may be provided to the LDPC repository for different codewords (e.g., depending on the LDPC code used to encode the codeword).

The decoder circuit 600 may iteratively decode the first codeword using the parity-check information associated with the first LDPC code (1050). For example, the LDPC decoder 630 may check each bit of the input codeword 606 against the parity-check matrix, update the values for the selected bits based on the parity-check operations, and output the bits (e.g., bits that have either passed or been corrected by the parity-check operations) as an output codeword 608.

In accordance with another aspect of the inventive arrangements described within this disclosure, a decoder circuit is capable of performing LDPC encoding in addition to LDPC decoding as described herein. For example, the LDPC decoder circuitry portion of the decoder circuit may implement a data path that is configurable at runtime (e.g., during operation) to perform LDPC encoding or LDPC decoding based on control information provided thereto. In one or more implementations, the LDPC decoder may be switched, on a per data block basis, between performing LDPC encoding or LDPC decoding during operation. In particular implementations, the LDPC decoder may further be switched on a per layer basis between performing LDPC encoding or LDPC decoding during operation. In each case, whether taking a per data block or a per layer approach, e.g., for purposes of interleaving, the particular LDPC codes used may also change for each data block or layer as the case may be. The decoder circuit is capable of performing LDPC encoding on received information using parity-check information for LDPC encoding that is stored in the LDPC repository. As such, the LDPC repository may be shared and used for both LDPC decoding and LDPC encoding. In some implementations, certain parity-check information stored in the LDPC repository is used for LDPC decoding while different parity-check information is used for LDPC encoding. In other implementations, the same parity-check information may be used for both LDPC decoding and LDPC encoding.

In one or more implementations, the parity-check information for LDPC encoding is generated in an offline process using one or more of the techniques described herein. For purposes of discussion and with reference to FIG. 2A, a parity-check matrix such as 200A and represented as H includes the information part 202, also referred to as N, and a parity part 204, also referred to as M. The information bits of a codeword can be denoted as S and the parity bits of the codeword as C. The product of H with the codeword [SC] is 0 and is given by expression 1 below.

$$[N\ M][{}_C^S]=0 \qquad (1)$$

Expression 1 can be rewritten as expression 2 below.

$$NS=MC \qquad (2)$$

If the parity part M of H only contains one new parity bit per row, as is the case with parity-check matrix 200A of FIG. 2A, the parity-check matrix is lower triangular. In the example of FIG. 2A, row b=1 includes a single parity bit a1. Row b=2 includes a single parity bit a2. Row b=3 has parity bits a2 and a3, where parity bit a3 is the only new parity bit introduced. As may be observed, each row of parity-check matrix 200A introduces one "new" parity bit. In such cases, it is possible to solve for C (the parity bits) using a back-substitution process where the decoder circuit uses expression 2 to solve for each row of the parity-check matrix. By processing each row of the parity-check matrix in turn (or a layer if P>1), the decoder circuit is capable of solving for the unknown parity bits to perform LDPC encoding of information.

For example, referring to parity-check matrix 200A of FIG. 2A, the first row in FIG. 2A is a parity equation involving only information bits i1, i3, i5, i7, i9, i11, i13, i14, i15, i17, and i19. The decoder circuit is capable of determining parity bit a1 by performing a modulo-2 sum (e.g., XORing the bits) of the information bits i1, i3, i5, i7, i9, i11, i13, i14, i15, i17, and i19. Since the modulo-2 sum of the information bits and the unknown parity bit must be zero, the modulo-2 sum of the information bits is the value for the parity bit a1. For example, if the modulo-2 sum of the information bits is 1, the parity bit a1 must be 1 to sum to 0. If the modulo-2 sum of the information bits is 0, the parity bit a1 must be 0 to sum to 0. The next row of H can be used to establish the next unknown parity bit, and so on until all the parity bits are determined.

In other cases, the parity-check matrix includes more than one new parity bit per row. For example, LDPC codes used in WiFi and 5G New Radio have parity-check matrices referred to as "double diagonal" matrices. The parity-check matrices for LDPC codes used in WiFi and 5G New Radio generally include more than one new parity bit per row. The techniques for generating parity bits for double diagonal matrices differ from the techniques for generating parity bits for lower triangular matrices. These processing techniques involve processing the parity-check matrix offline to generate a derivative of the parity-check matrix that may be used for LDPC encoding. A description of the derivative of the parity-check matrix may be loaded into the decoder circuit and used to perform LDPC encoding.

For example, a first technique for processing a double diagonal type of parity-check matrix H involves reducing the parity portion of H (e.g., reduce M) to a lower triangular form. The parity portion of H can be reduced so that H is in lower triangular form by adding rows to H. The resulting matrix is a lower triangular matrix that is suitable for LDPC encoding. The resulting matrix, however, is no longer suitable for LDPC decoding. Appreciably, parity-check information specifying the derivative of the parity-check matrix may be generated and stored in the decoder circuit for purposes of LDPC encoding while other parity-check information specifying the original parity-check matrix is also stored for purposes of decoding, if need be.

The first technique requires that rows be added to the parity-check matrix H to remove parity bits above the diagonal to create a lower diagonal portion. For example, adding a row to H that has an element with the same rotation will result in cancellation since the diagonals line up on one another and two 1 values sum to 0. This allows a 1 in the parity column to be eliminated for a row. When elements in the row are added with different rotations, an increase in the number of circulants occurs. As such, the first technique for reducing the parity portion of H can be used to reduce the parity part to lower triangular. The first technique, however, may result in an increase in the number of circulants in other portions of H, which can be computationally expensive.

In one or more other implementations, a second technique for processing certain double diagonal parity-check matrices involves summing all rows of H to produce an equation containing only a single parity bit. The result can be used with the original matrix to solve for the parity bits. The second technique exploits the property of certain double diagonal matrices (e.g., those corresponding to Wifi and 5G New Radio codes) where the summation of all the rows results in the cancellation of all but one of the parity columns. The decoder circuit is capable of solving this new equation to obtain the first parity column. The decoder circuit may then use the original parity-check matrix to obtain the remaining parity columns.

Figure 16:
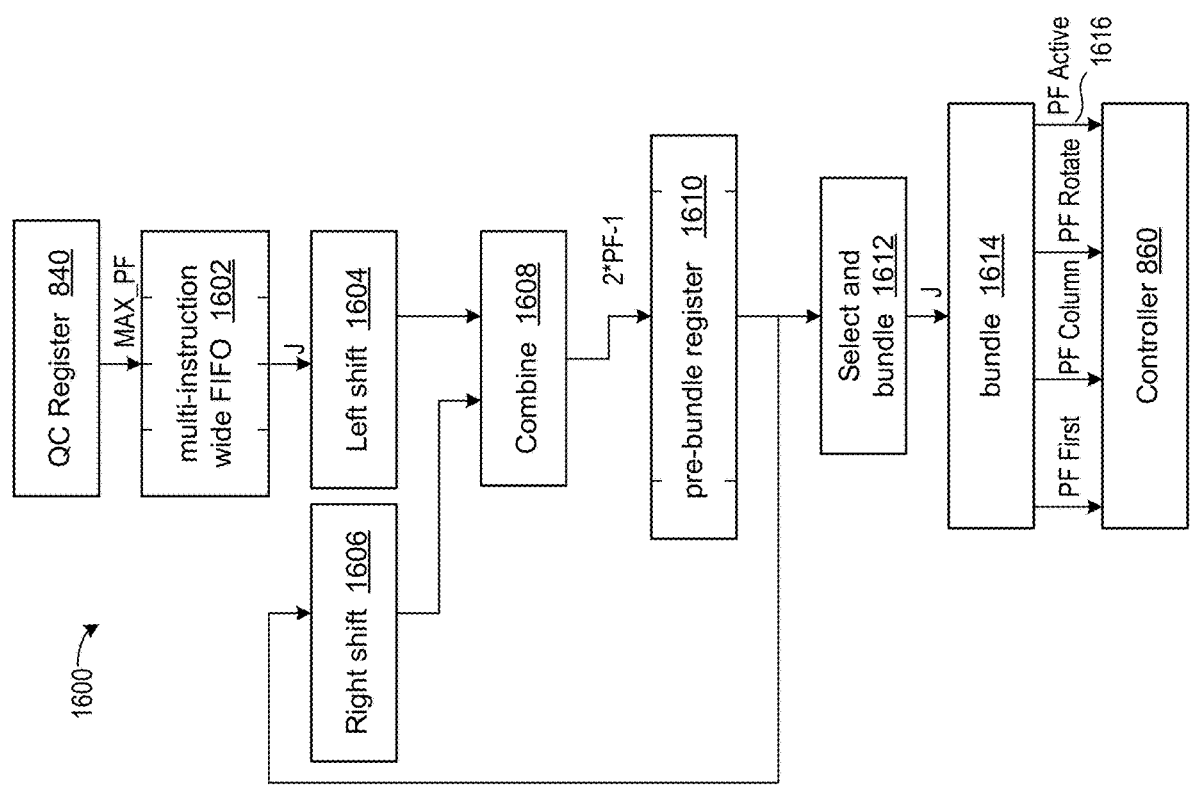
FIG. 16 shows exemplary circuitry for bundling instructions that direct circulant operations on an input codeword.
Figure 17:
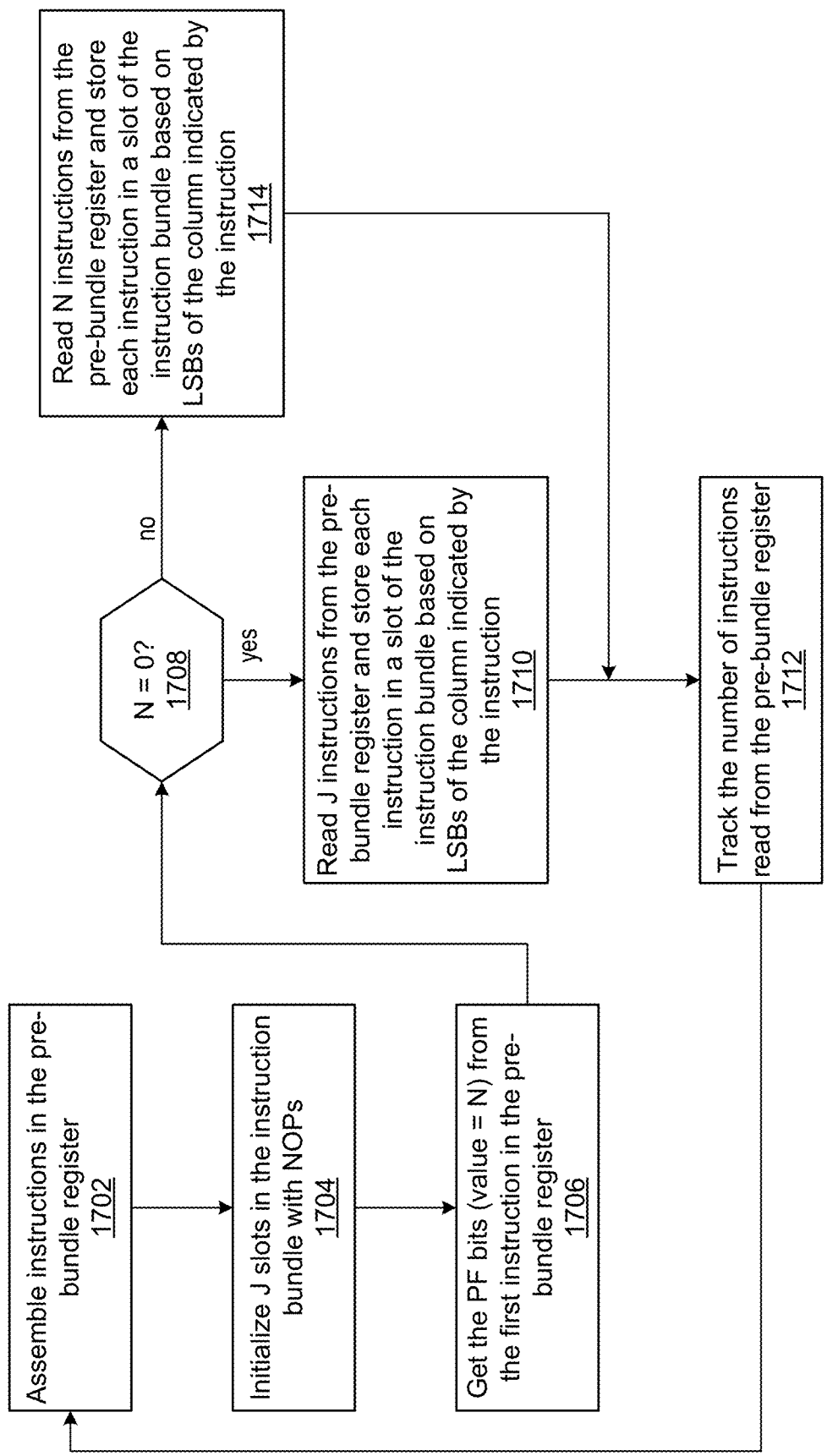
FIG. 17 shows a flowchart of an exemplary process of packing instructions in a bundle, such as performed by the bundling circuitry of FIG. 16.

FIGS. 11-15 illustrate how the encoding of NOP instructions as part of other instructions that direct circulant operations reduces memory requirements for instructions sets associated with LDPC codes. FIGS. 16-17 show circuits and methods for decoding the encoded information in the instructions sets for inserting the desired number of NOP instructions at the desired locations in the instruction stream.

FIG. 11 shows an example of an LDPC base matrix 1100. The rows, columns and rotation values in the cells of the matrix are used in the instructions sets of FIGS. 12 and 13 and in the instruction bundles of FIGS. 14 and 15. A value of −1 in a cell of a particular column and row/layer indicates that no circulant operation is to be performed on the input codeword for that column and row/layer.

Figure 12:
FIG. 12 shows a set of instructions that illustrates the storage requirements resulting from explicit NOP instructions in the instruction set for the LDPC base matrix of FIG. 11 in an implementation that does not employ the PF field in the instructions shown by the QC register.

FIG. 12 shows a set of instructions 1200 that illustrates the storage requirements resulting from explicit NOP instructions in the instruction set for the LDPC base matrix of FIG. 11 in an implementation that does not employ the PF field in the instructions shown by the QC register 740 (FIG. 7B). FIG. 12 shows explicit NOP instructions and illustrates the instruction storage requirements in an approach that does not employ the PF field for the example of FIG. 11, whereas FIG. 13 shows how the PF field avoids storage of explicit NOP instructions. The instruction set 1200 has 40 instructions, numbered 0-39 and listed in row-major order. The instructions correspond to the cells of the LDPC base matrix 1100 of FIG. 11, which has 4 layers and 10 columns for a total of 40 cells. Ten of the 40 instructions are explicit NOP instructions and correspond to the −1 values in the cells of the LDPC base matrix 1100.

The layer number and an instruction number are listed for each instruction, though the instruction numbers and layer numbers need not be stored as part of the instructions. Though not shown, each instruction can further include bits that indicate the first use of the associated column and the last circulant of the base matrix.

FIG. 13 shows a set of instructions 1300 that illustrates the storage requirements for instructions that are coded to avoid explicit specification of NOP instructions for the LDPC base matrix of FIG. 11. Notably, the instruction set 1300 does not contain any NOP instructions and can be used for multiple different packing factors (e.g., 1, 2 and 4), thereby condensing three instruction sets, for example, into a single instruction set, and reducing the number of instructions from 40 to 25.

The instruction set shows the sequential order in which instructions are selected and bundled for processing by the LDPC decoder circuit 900 (FIG. 9). Non-NOP instructions are inserted in the bundles based on the configured packing factor and the coding in the PF2 and PF4 fields of the instructions. The PF2 and PF4 fields of the instructions specify the number of instructions from the sequence to include in a bundle of 2 instructions or a bundle of 4 instructions for packing factors 2 and 4, respectively. The special value 0 in the PF2 field indicates 2 instructions from the sequence are to be selected and included in a bundle of 2 instructions. Similarly, the special value 0 in the PF4 field indicates 4 instructions from the sequence are to be selected and included in a bundle of 4 instructions.

FIGS. 14 and 15 show how the instructions of instruction set 1300 are decoded and bundles of instructions assembled based on the PF4 and PF2 fields for packing factors 4 and 2, respectively.

FIG. 14 shows the bundles of instructions assembled for packing factor 4 based on the instruction set 1300 of FIG. 13 and the PF4 bits of the instructions. The table 1400 shows the bundles of instructions assembled for decoding an input codeword based a packing factor of 4 and insertion of NOPs indicated by the PF4 bits in the instructions read from the QC register 740 (FIG. 7B). NOPs have been inserted in the bundles according to the values of the PF4 bits in the instructions, the values of which are shown in the PF4 column in instruction set 1300.

The table 1400 shows bundles labeled 0-11 and the layer of the LDPC base matrix with which the instructions of each bundle are associated. The layers can have different numbers of associated bundles because of the number of required NOPs and the resulting packing. For example, two bundles of instructions are associated with layer 1, and layers 2, 3, and 4 each have 3 bundles of instructions.

A bundler circuit (e.g., FIG. 16) generally assembles the bundles shown in table 1400 as follows. The examples assume that the bundler circuit is configured to operate with a packing factor 4 and in response examines the PF4 bits of the instruction set 1300. The instructions of the instruction set are read in order, 0-24. Instruction 0 of instruction set 1300 has a value 0 in the PF4 field, which indicates that 4 instructions are to be packed in the bundle. The 4 instructions include the current instruction 0 and the next three instructions 1, 2, and 3. Thus, the 4 instructions in bundle 0 as shown in table 1400, are the instructions 0, 1, 2, and 3 from instruction set 1300 and direct rotations of 174, 97, 166, and 66, respectively.

As described above, each slot in the bundle is associated with a different memory bank, which stores a different sub-vector of the input codeword. Each sub-vector of the input codeword is associated with one of the columns of the LDPC base matrix 1100 (FIG. 11). Table 1400 shows an abbreviated notation to indicate the instructions in the slots of the bundles. That is, only the rotation values of the instructions are shown in the slots of the bundles and the actual instructions have additional fields.

In the next cycle, the instructions of bundle 1 are assembled. From instruction set 1300, instruction 4 is the next instruction in the sequence after instruction 3. The PF4 bits of instruction 4 have a value 2, which indicates that 2 instructions from the instruction set 1300 are to put in the bundle. The two instructions include the current instruction 4 having the rotation value 0 and the next instruction 5 having the rotation value 0. The bundler circuit puts NOPs in the remaining two slots of the bundle 1 as shown in table 1400. The slots of the bundle in which each instruction is inserted is a modulus function of the associated column and the packing factor (column mod 4). Thus, instruction 4 is placed in slot 2 (6 mod 4=2) of the bundle, and instruction 5 is placed in slot 3 (7 mod 4=3) of the bundle as shown in table 1400.

After completing bundle 1 and submitting the bundle of instructions for processing, the bundler circuit can begin assembling bundle 2. Instruction 5 of instruction set 1300 was the last instruction included in bundle 1. Thus, the next instruction in the sequence is instruction 6. The PF4 bits of instruction 6 have a value 2. Thus, instruction 6 and instruction 7 are included in bundle 2 as shown in table 1400. Instruction 6 is associated with column 0, and instruction 7 is associated with column 3 as shown in the instruction set 1300. Thus, instruction 6 is placed in slot 0 of the bundle, and instruction 7 is placed in slot 3 of the bundle.

The remaining bundles shown in table 1400 are assembled as described above.

FIG. 15 shows the bundles of instructions assembled for packing factor 2 based on the instruction set 1300 of FIG. 13 and the PF2 bits of the instructions. The table 1500 shows the bundles of instructions assembled for decoding an input codeword based on a packing factor of 2 and expansion indicated by the PF field bits in the instructions read from the QC register 740 (FIG. 7B). NOPs have been inserted in the bundles according to the values of the PF field in the instructions, the values of which are shown as the PF2 bits in instruction set 1300. The column number specified by each instruction is used to determine the slot of the bundle into which the instruction is inserted. Instructions for even-numbered columns are inserted in slot 0, and instructions for odd-numbered columns are inserted in slot 1.

In the first cycle of decoding an input codeword, the bundler circuit (FIG. 16) assembles bundle 0. As the value of the PF2 bits is 0 in instruction 0 in the instruction set 1300 of FIG. 13, two instructions in the sequence, the current instruction 0 and the next instruction 1 are put into slots 0 and 1 of bundle 0, as shown in table 1500. The process is repeated for the other instructions in the instruction set 1300. Instruction 16 in the instruction set 1300 is the only instruction in which the value of the PF2 bits indicates that one instruction and one NOP are to be included in the bundle, which is bundle 8 in table 1500.

FIG. 16 shows exemplary circuitry for bundling instructions that direct circulant operations on an input codeword. The bundling circuitry 1600 can be disposed between the QC register 840 and controller circuit 860, which are also shown in FIG. 8.

The circuitry reads MAX_PF instructions at a time from QC register 840 into a multi-instruction wide first-in-first-out (FIFO) buffer 1602. For example, to accommodate a maximum packing factor of 4, the FIFO buffer 1602 is 4 instructions wide and MAX_PF=4. Once the select and bundle circuit 1612 selects and bundles instructions from pre-bundle register 1610 according to the PF bits in the right-most instruction in the pre-bundle register, the left shift circuit 1604, right shift circuit 1606, and combine circuit 1608 configure the next set of instructions in the pre-bundle register 1610.

The left shift circuit 1604 left shifts the MAX_PF instructions at the output of the FIFO buffer 1602 by the number of instruction remaining in the pre-bundle register 1610 after the select and bundle circuit 1612 has read the number of instructions, J, specified by the PF bits of the right-most instruction in the pre-bundle register. The right shift circuit 1606 shifts right the instructions in the pre-bundle register by the number of instructions that were read from pre-bundle register 1610 and packed in the bundle 1614. The combine circuit 1608 combines the right-shifted instructions from the right shift circuit 1606, which are the instructions remaining in the pre-bundle register after the select and bundle circuit 1612 has read the specified number of instructions, and the left-shifted new instructions from the left shift circuit 1604. The pre-bundle register 1610 can be sized to store up to 2*MAX_PF-1 instructions to ensure that there is a sufficient number of instructions available in each cycle to fully pack the bundle The select and bundle circuit reads J instructions from the pre-bundle register and outputs the instructions in a bundle 1614. Bundle 1614 can be a register circuit having MAX_PF slots that are populated by PF instructions. Each slot has one instruction, which can be either an instruction read from the pre-bundle register 1610 or a NOP inserted by the select and bundle circuit 1612. In each cycle, the select and bundle circuit 1612 initializes the bundle 1614 with NOP instructions. Then the select and bundle circuit puts the instruction(s) read from the pre-bundle register into the slot(s) of the bundle that corresponds to the column of the LDPC base matrix associated with the instruction(s). Thus, any slots not written to with an instruction read from the pre-bundle register have NOPs.

The PF instructions in the bundle 1614 are input to the controller circuit 860, as shown by the PF first fields, column fields, and rotate fields. The PF active signals 1616 indicate which instructions in the slots direct circulant operations and which of the slots are NOPs. The controller 860 can provide the PF instructions to PF slices instances of the decoder circuit 900 of FIG. 9.

The active signal 1616 can be further used to disable read enables to save power and to disable write enables to avoid erroneous memory updates in processing NOPs. Specifically, the active signal can disable read enables and write enables to memory banks in which input LLR values and updated LLR values are stored. Disabling write enables avoids writing to the associated bank when processing a NOP. Disabling the read enables reduces power consumption.

The active signal 1616 can also be used to disable write enables and read enables to rotation memories, and avoid the need for the unrotate block 980 (FIG. 9). In addition, the active signal can disable input of data to the MS minimum generator 940 (FIG. 9) to avoid that data contributing to the operation. The active signal can further be used to save power by disabling parts of the decoder circuit 900 processing NOPs, such as pipeline registers (FIFOs 950, 960, and 970), MS rotation circuit 930, subtraction circuit 904, multiplication circuit 906, etc.

FIG. 17 shows a flowchart of an exemplary process of packing instructions in a bundle, such as performed by the bundling circuitry 1600 of FIG. 16. At block 1702, the bundling circuitry assembles instructions in the pre-bundle register 1610 (FIG. 16). All J slots of the instruction bundle are initialized with NOPs at block 1704.

At block 1706, the bundling circuitry reads the PF field from the first instruction (e.g., right-most instruction) in the pre-bundle register. For a packing factor of 4, the 2 bits for PF4 are read, or for a packing factor of 2, the 1 bit for PF2 is read, for example (FIG. 7B). The value of the PF bits indicates the number of instructions to read from the sequential instruction set and pack in the bundle. The value 0 indicates J (the number of slots in the bundle) instructions are to be read. If the value=0 at decision block 1708, the bundling circuitry reads J instructions at block 1710 from the pre-bundle register and stores the instructions in the proper slots of the bundle. In an exemplary implementation, the LSBs of the column field of the instruction indicates the proper slot.

If the value of the PF bits is not equal to 0, at block 1714 the bundling circuitry reads the number of instructions indicated by the value of the PF bits from the pre-bundle register and stores the instructions in the proper slots in the bundle. As the value of the PF bits is not 0, the number of instructions read from the pre-bundle register is less than the number of slots in the bundle, and one or more of the slots in the bundle will have NOPs.

At block 1712, the bundling circuitry tracks the number of instructions read from the pre-bundle register and uses that value to assemble the next set of instructions in the pre-bundle register at block 1702. The number of instructions read from the pre-bundle controls the left shift circuit 1604 and right shift circuit 1606 as shown in FIG. 16.

Though aspects and features may in some cases be described in individual figures, it will be appreciated that features from one figure can be combined with features of another figure even though the combination is not explicitly shown or explicitly described as a combination.

The circuits and methods are thought to be applicable to a variety of systems for LDPC decoding. Other aspects and features will be apparent to those skilled in the art from consideration of the specification. The circuits and methods may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A circuit arrangement comprising:
   low-density parity check (LDPC) decoder circuitry including two or more parallel decoder circuits configured to decode an input codeword using a plurality of circulant matrices of a parity check matrix for an LDPC code;
   a plurality of memory banks coupled to the LDPC decoder circuitry and configured to store elements of the input codeword;
   a memory circuit configured for storage of an instruction sequence, each instruction describing for one of the plurality of circulant matrices, a corresponding layer and column of the parity check matrix and a rotation, and each instruction including packing factor bits having a value indicative of a number of instructions of the instruction sequence to be assembled in a bundle of instructions;
   a bundler circuit coupled to the memory circuit and to the LDPC decoder circuitry, the bundler circuit configured to:
      assemble a bundle of instructions including the number of instructions from the memory circuit;
      specify a no-operation code in each slot of the bundle other than a slot that is filled with an instruction from the instruction sequence; and
      provide each slot of the bundle to a respective one of the parallel decoder circuits; and
   wherein in response to an instruction in a slot of the bundle, the respective decoder circuit performs a circulant operation specified by the instruction, and in response to the no-operation code in a slot of the bundle, the respective decoder circuit is idle.

2. The circuit arrangement of claim 1, wherein each instruction slot in the bundle of instructions is associated with a different one of the circulant matrices.

3. The circuit arrangement of claim 1, wherein the packing factor bits indicate for at least two different packing factors, two or more values indicative of two or more numbers of instructions of the instruction sequence to be assembled in the bundle of instructions.

4. The circuit arrangement of claim 3, wherein:
   the packing factor bits include one bit for a packing factor of two and two bits for a packing factor of four; and the bundler circuit is further configured to determine the value indicative of a number of instructions of the instruction sequence to be assembled in the bundle of instructions from either the one bit for the packing factor of two or the two bits for the packing factor of four.

5. The circuit arrangement of claim 1, wherein:
   the memory circuit is configured with a plurality of instruction sequences, each instruction sequence associated with a different LDPC code of a plurality of LDPC codes; and
   the bundler circuit (1600) is further configured to select one instruction sequence of the plurality of instruction sequences.

6. The circuit arrangement of claim 1, wherein elements of each sub-vector of the input codeword are stored across two or more of the plurality of memory banks.

7. The circuit arrangement of claim 1, wherein all elements of each sub-vector of the input codeword are stored in one of the plurality of memory banks.

8. The circuit arrangement of claim 1, wherein elements of each sub-vector of the input codeword associated with an even column of the parity check matrix are stored in a first subset of the memory banks, and elements of each sub-vector of the input codeword associated with an odd column of the parity check matrix are stored in a second subset of the memory banks that is disjoint from the first subset of the memory banks.

9. The circuit arrangement of claim 1, wherein:
   the plurality of memory banks is N memory banks; and
   the elements of each sub-vector of the input codeword are stored in one of the memory banks referenced by a modulus function of a column number of the parity check matrix with which the sub-vector is associated and N.

10. The circuit arrangement of claim 1, wherein:
    each instruction slot in the bundle of instructions is associated with a different one of the circulant matrices;
    the packing factor bits include one bit for a packing factor of two and two bits for a packing factor of four;
    the bundler circuit is further configured to determine the value indicative of a number of instructions of the instruction sequence to be assembled in the bundle of instructions from either the one bit for the packing factor of two or the two bits for the packing factor of four;
    the memory circuit is configured with a plurality of instruction sequences, each instruction sequence associated with a different LDPC code of a plurality of LDPC codes; and
    the bundler circuit is further configured to select one instruction sequence of the plurality of instruction sequences.

11. A method comprising:
    storing an instruction sequence in a memory circuit, each instruction of the sequence describing for one of a plurality of circulant matrices of a parity check matrix for a low-density parity check (LDPC) code, a corresponding layer and column of the parity check matrix and a rotation, and each instruction including packing factor bits having a value indicative of a number of instructions of the instruction sequence to be assembled in a bundle of instructions;
    storing elements of an input code word in a plurality of memory banks;

assembling by a bundler circuit, a bundle of instructions including the number of instructions from the memory circuit;

specifying a no-operation code in each slot of the bundle other than a slot that is filled with an instruction from the instruction sequence; and providing each slot of the bundle to a respective decoder circuit of two or more parallel decoder circuits of LDPC decoder circuitry;

decoding by the LDPC decoder circuitry, an input codeword according to the bundle of instructions using the plurality of circulant matrices, wherein the decoding includes performing a circulant operation by the respective decoder circuit in response to an instruction in the slot of the bundle, and idling the respective decoder circuit in response to a no-operation code in the slot of the bundle.

12. The method of claim 11, wherein each instruction slot in the bundle of instructions is associated with a different one of the circulant matrices.

13. The method of claim 11, wherein the packing factor bits indicate for at least two different packing factors, two or more values indicative of two or more numbers of instructions of the instruction sequence to be assembled in the bundle of instructions.

14. The method of claim 13, wherein:

the packing factor bits include one bit for a packing factor of two and two bits for a packing factor of four; and the bundler circuit is further configured to determine the value indicative of a number of instructions of the instruction sequence to be assembled in the bundle of instructions from either the one bit for the packing factor of two or the two bits for the packing factor of four.

15. The method of claim 11, further comprising:

storing a plurality of instruction sequences in the memory circuit, each instruction sequence associated with a different LDPC code of a plurality of LDPC codes; and selecting by the bundler circuit, one instruction sequence of the plurality of instruction sequences.

16. The method of claim 11, further comprising, storing elements of each sub-vector of the input codeword across two or more of the plurality of memory banks.

17. The method of claim 11, further comprising, storing all elements of each sub-vector of the input codeword in one of the plurality of memory banks.

18. The method of claim 11, further comprising:

storing elements of each sub-vector of the input codeword associated with an even column of the parity check matrix in a first subset of the memory banks; and storing elements of each sub-vector of the input codeword associated with an odd column of the parity check matrix in a second subset of the memory banks that is disjoint from the first subset of the memory banks.

19. The method of claim 11, wherein:

the plurality of memory banks is N memory banks; and the elements of each sub-vector of the input codeword are stored in one of the memory banks referenced by a modulus function of a column number of the parity check matrix with which the sub-vector is associated and N.

20. The method of claim 11, wherein each instruction slot in the bundle of instructions is associated with a different one of the circulant matrices, and the packing factor bits include one bit for a packing factor of two and two bits for a packing factor of four, and the method further comprising:

determining by the bundler circuit, the value indicative of a number of instructions of the instruction sequence to be assembled in the bundle of instructions from either the one bit for the packing factor of two or the two bits for the packing factor of four;

storing a plurality of instruction sequences in the memory circuit, each instruction sequence associated with a different LDPC code of a plurality of LDPC codes; and selecting by the bundler circuit, one instruction sequence of the plurality of instruction sequences.

* * * * *